(12) United States Patent
Xu et al.

(10) Patent No.: US 10,666,391 B2
(45) Date of Patent: May 26, 2020

(54) METHOD FOR ENCODING INFORMATION BIT SEQUENCE IN COMMUNICATION NETWORK

(71) Applicant: HUAWEI TECHNOLOGIES CO., LTD., Shenzhen, Guangdong (CN)

(72) Inventors: Chen Xu, Hangzhou (CN); Rong Li, Hangzhou (CN); Gongzheng Zhang, Hangzhou (CN); Yue Zhou, Hangzhou (CN); Lingchen Huang, Hangzhou (CN); Yunfei Qiao, Hangzhou (CN); Carmela Cozzo, San Diego, CA (US); Yiqun Ge, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/249,910

(22) Filed: Jan. 17, 2019

(65) Prior Publication Data

US 2019/0149268 A1 May 16, 2019

Related U.S. Application Data

(63) Continuation of application No. PCT/CN2018/087134, filed on May 16, 2018.

(30) Foreign Application Priority Data

Sep. 30, 2017 (CN) .......................... 2017 1 0916204

(51) Int. Cl.
*H04L 1/00* (2006.01)
*H03M 13/13* (2006.01)

(52) U.S. Cl.
CPC .......... *H04L 1/0064* (2013.01); *H03M 13/13* (2013.01); *H04L 1/0008* (2013.01);
(Continued)

(58) Field of Classification Search
CPC .... H04L 1/0064; H04L 1/0058; H04L 1/0068
See application file for complete search history.

(56) References Cited

U.S. PATENT DOCUMENTS 8,750,223 B2 * 6/2014 Jang ..................... H04L 1/0042
370/310
2006/0195752 A1 * 8/2006 Walker ................. H04L 1/0045
714/748

(Continued)

FOREIGN PATENT DOCUMENTS

CN 103516476 A 1/2014
CN 103825669 A 5/2014
(Continued)

OTHER PUBLICATIONS

R1-1715322 Huawei,"TS38.212 v0.1.1 NR; Multiplexing and channel coding"—3GPP TS 38.212 V0.1.1 (Sep. 2017),3rd Generation Partnership Project;Technical Specification Group Radio Access Network;NR;Multiplexing and channel coding(Release 15),dated Sep. 29, 2017,total 29 pages.

(Continued)

*Primary Examiner* — Guy J Lamarre
(74) *Attorney, Agent, or Firm* — Huawei Technologies Co., Ltd.

(57) ABSTRACT

Embodiments of this application provide a method for encoding data in a wireless communication network. A communication device obtains an information bit sequence of a bit length K and a code length M. When M is greater than or equal to a first threshold and K is greater than or equal to a second threshold, the device divides the information bit sequence into p subsequences that are of an equal length $K_1$. Then the device encodes each of the p subsequence to obtain p encoded subsequences. The device rate-matches each of the p encoded subsequences to obtain p rate matched subsequences, concatenates the p rate matched (Continued)

subsequences to obtain the output sequence of the code length M, then outputs the output sequence.

14 Claims, 15 Drawing Sheets

(52) U.S. Cl.
CPC .......... *H04L 1/0041* (2013.01); *H04L 1/0045* (2013.01); *H04L 1/0057* (2013.01); *H04L 1/0058* (2013.01); *H04L 1/0067* (2013.01); *H04L 1/0068* (2013.01); *H04L 1/0071* (2013.01)

(56) References Cited

U.S. PATENT DOCUMENTS

| | | | |
|---|---|---|---|
| 2009/0046672 A1* | 2/2009 | Malladi | H04L 1/0067 370/336 |
| 2011/0320922 A1* | 12/2011 | Pietraski | H04L 1/0041 714/807 |
| 2012/0134306 A1* | 5/2012 | Cheng | H04W 72/0413 370/281 |
| 2014/0153654 A1* | 6/2014 | Vojcic | H04N 19/65 375/240.28 |
| 2015/0103947 A1* | 4/2015 | Shen | H04B 1/04 375/295 |
| 2015/0249473 A1 | 9/2015 | Li et al. | |
| 2015/0381208 A1 | 12/2015 | Li et al. | |
| 2016/0164629 A1 | 6/2016 | Ann Joonkui et al. | |
| 2016/0218743 A1 | 7/2016 | Li et al. | |
| 2016/0294418 A1 | 10/2016 | Huang et al. | |
| 2017/0047947 A1 | 2/2017 | Hong et al. | |
| 2018/0198564 A1* | 7/2018 | Yang | H03M 13/6356 |

FOREIGN PATENT DOCUMENTS

| | | |
|---|---|---|
| CN | 103888151 A | 6/2014 |
| CN | 104038234 A | 9/2014 |
| CN | 104283630 A | 1/2015 |
| CN | 105897379 A | 8/2016 |
| CN | 106603191 A | 4/2017 |
| CN | 106850142 A | 6/2017 |
| CN | 106888026 A | 6/2017 |
| EP | 3598673 A1 | 1/2020 |

OTHER PUBLICATIONS

ZTE,"Segmentation of Polar codes for large UCI",3GPP TSG RAN WG1 Meeting #90 R1-1713237,Prague, Czechia, Aug. 21-25, 2017,total 6 pages.

Qualcomm Incorporated, "Design of Polar code for large UCI with segmentation", 3GPP TSG-RAN WG1 NA Ad-Hoc#2 R1-1711221,Jun. 27-30, 2017,total 4 pages.

ZTE et al., "Segmentation of Polar code for large UCI",3GPP TSG RAN WG1 NR Ad-Hoc#3 R1-1715667,Nagoya,Japan, Sep. 18-21, 2017,total 8 pages.

ZTE et al., "WF of Polar code segmentation for large UCI",3GPP TSG RAN WG1 NR Ad-Hoc#3 R1-1716852, Sep. 18-21, 2017,total 7 pages.

* cited by examiner

METHOD FOR ENCODING INFORMATION BIT SEQUENCE IN COMMUNICATION NETWORK

CROSS-REFERENCE TO RELATED APPLICATIONS

This application is a continuation of International Application No. PCT/CN2018/087134, filed on May 16, 2018, which claims priority to Chinese Patent Application No. 201710916204.3, filed on Sep. 30, 2017. The disclosures of the aforementioned patent applications are hereby incorporated by reference in their entireties.

TECHNICAL FIELD

Embodiments of the application relate to the communications field, and more specifically, to method and apparatus for encoding information bit sequence in communication network.

BACKGROUND

Channel encoding is used in communication systems to improve data transmission reliability, so as to ensure communication quality. Polar codes, proposed by Professor Arikan of Turkey, are the first kind of codes that are theoretically proven to be able to achieve the Shannon capacity and having low encoding and decoding complexity.

A polar code is a linear block code. An encoding matrix of the polar code is $G_N$, which is an N×N matrix.

An encoding process for generating a polar code $x_1^N$ ($x_1^N = x_1, x_2, \ldots, x_N$) is:

$$x_1^N = u_1^N G_N,$$

where $u_1^N = (u_1, u_2, \ldots, u_N)$ is a binary row vector having a length of N bits (N is also called a mother code length), $G_N$ is the coding matrix, and $G_N = F_2^{\otimes(\log_2(N))}$. $F_2^{\otimes(\log_2(N))}$ is a Kronecker product of a number $\log_2 N$ of matrices $F_2$, and the matrix $F_2$ is:

$$F_2 = \begin{bmatrix} 1 & 0 \\ 1 & 1 \end{bmatrix}.$$

In the encoding process of the polar code, some bits in the row vector $u_1^N$ are used to carry information, and these bits are referred to as information bits. An index set of these bits is represented by a set A. Other bits are set to a fixed value that is pre-agreed upon between a receiving end and a transmitting end of the polar code, and these bits are referred to as fixed bits or frozen bits. An index set of the fixed bits or frozen bits is represented by a set $A^c$, which is a complement set of set A.

The encoding process of the polar code $x_1^N = u_1^N G_N$ is equivalent to $x_1^N = u_A G_N(A) \oplus u_{A^c} G_N(A^c)$. Herein, $G_N(A)$ is a submatrix formed by rows in the $G_N$ that correspond to indexes in the set A, and $G_N(A^c)$ is a submatrix formed by rows in the $G_N$ that correspond to indexes in the set $A^c$. $u_{A^c}$ is an information bit set of the $u_1^N$, and the number of the information bits in the $u_{A^c}$ is K. $u_{A^c}$ is a frozen bit set of the $u_1^N$, and the number of the frozen bits in the $u_A^C$ is N−K. The frozen bits are known bits. Value of the frozen bits is normally set to 0, but the value of the frozen bits may be randomly set, provided that the receiving end and the transmitting end of the polar code have pre-agreed on the value of the frozen bits. When the frozen bits are set to 0, a polar code encoding output may be simplified as $x_1^N = u_A G_N(A)$, in which $G_N(A)$ is a K×N matrix.

A process of constructing a polar code is a process of selecting the set A, and the selection of the set A determines the performance of the polar code. The process of constructing the polar code normally includes: determining, based on a mother code length N, that a total of N polarized channels exist, where each of the polarized channels corresponds to one row in an encoding matrix, respectively; calculating a reliability of each of the polarized channels; forming the information bit index set A using indexes of first K polarized channels with relatively high reliabilities, and forming the frozen bit index set $A^c$ using indexes of the remaining (N−K) polarized channels. The set A determines bit positions of the information bits in $x_1^N$, and the set $A^c$ determines bit positions of the frozen bits in $x_1^N$.

It can be learned from the encoding matrix that a code length of an original polar code (mother code) is an integer power of 2. In practical applications, however, length of a polar code need to be set to any code length, and this is achieved by a process called rate matching.

In the prior art, there are three main rate matching schemes of the polar code: puncturing, shortening, and repetition. In the first two schemes, a mother code whose length exceeds a target code length is usually punctured or shortened, to achieve the target code length. The punctured or shortened code is filled during decoding, to restore to the length of the mother code. Before decoding, a log-likelihood ratio LLR of the corresponding location is restored according to a predetermined rule, to implement rate de-matching.

To balance encoding performance with encoding complexity, the communication system may determine, according to an agreed rule, to use a repetition-based rate matching scheme. A polar code obtained through encoding using a mother code length is repeated, to obtain a target code length greater than the mother code length, thereby implementing rate matching of the polar code. Different from puncturing or shortening, repetition refers to repeatedly sending, in a specific sequence, an encoded bit sequence that is encoded as the mother code length, until the target code length is reached, thereby implementing rate matching. A decoder combines log-likelihood ratios (LLR) of repetition locations to implement rate de-matching, and performs decoding by using the determined mother code length. Repetition can reduce decoding complexity, a delay, and a hardware implementation. However, in some cases, repetition causes a loss to polar code performance.

SUMMARY

Embodiments of the this application provides an encoding method, an encoding apparatus, a decoding method, and a decoding apparatus, which can reduce times of using a repetition-based rate matching scheme, and reduce a performance loss caused by repetition.

According to a first aspect, in embodiments of this application, an encoding method is provided. The encoding method includes: obtaining a to-be-encoded information bit sequence; dividing the to-be-encoded information bit sequence into p segments if a coding parameter meets a preset segmentation condition; and separately performing polar encoding on the p segments to obtain p encoded bit sequences, where p is an integer greater than 1.

In a possible implementation, the method further includes: separately rate-matching the p encoded bit sequences, separately interleaving the p rate matching output segments, and concatenating the p interleaved segments. The p segments are first separately interleaved, so that an existing interleaver can be reused, and the interleaver does not need to be reformed.

Alternatively, the method further includes: separately rate-matching the p encoded bit sequences, concatenating the p rate matching output segments, and interleaving a concatenated bit sequence. The concatenation is performed before the interleaving, and therefore only one interleaver needs to be designed.

According to a second aspect, in embodiments of this application, an encoding apparatus is provided. The encoding apparatus includes: an obtaining unit, configured to obtain a to-be-encoded information bit sequence; a segmentation unit, configured to divide the to-be-encoded information bit sequence into p segments if a coding parameter meets a preset segmentation condition, where p is an integer greater than 1; and an encoding unit, configured to separately perform polar encoding on the p segments to obtain p encoded bit sequences.

In a possible implementation, the encoding apparatus further includes a rate matching unit, an interleaving unit, and a concatenation unit. The rate matching unit is configured to separately rate-match the p encoded bit sequences; the interleaving unit is configured to separately interleave the p rate matching output segments; and the concatenation unit is configured to concatenate the p interleaved segments. Alternatively, the rate matching unit is configured to separately rate-match the p encoded bit sequences; the concatenation unit is configured to concatenate the p rate matching output segments; and the interleaving unit is configured to interleave a concatenated bit sequence.

According to a third aspect, in embodiments of this application, a computer-readable storage medium is provided. The computer-readable storage medium includes: an instruction for obtaining a to-be-encoded information bit sequence; an instruction for dividing the to-be-encoded information bit sequence into p segments if a coding parameter meets a preset segmentation condition; and an instruction for separately performing polar encoding on the p segments to obtain p encoded bit sequences, where p is an integer greater than 1.

According to a fourth aspect, in embodiments of this application, a decoding method is provided. The decoding method includes: obtaining a log-likelihood ratio (LLR) sequence corresponding to to-be-decoded bits; de-concatenating the LLR sequence if a coding parameter meets a preset segmentation condition, to obtain LLR sequences of p segments, where p is an integer greater than 1; separately performing successive cancellation list (SCL) decoding on the LLR sequences of the p segments, to obtain decoding results of the p segments; and combining the decoding results of the p segments, and outputting a decoded bit sequence.

In a possible implementation, after the de-concatenation and before the SCL decoding, the method further includes: separately de-interleaving the p de-concatenated segments, and rate de-matching the p de-interleaved segments.

In a possible implementation, before de-concatenation, the method further includes: de-interleaving the obtained LLR sequence; and before the SCL decoding, the method further includes: separately rate de-matching the p de-concatenated segments.

According to a fifth aspect, in embodiments of this application, a decoding apparatus is provided. The decoding apparatus includes: an obtaining unit, configured to obtain a log-likelihood ratio (LLR) sequence corresponding to to-be-decoded bits; a de-concatenation unit, configured to de-concatenate the LLR sequence if a coding parameter meets a preset segmentation condition, to obtain LLR sequences of p segments, where p is an integer greater than 1; a decoding unit, configured to separately perform SCL decoding on the LLR sequences of the p segments, to obtain decoding results of the p segments; and a combination unit, configured to: combine the decoding results, of the p segments, that are obtained by the decoding unit, and output a decoded bit sequence.

In a possible implementation, the decoding apparatus further includes a de-interleaving unit and a rate de-matching unit. The de-interleaving unit is configured to separately de-interleave the de-concatenated LLR sequences of the p segments; the rate de-matching unit is configured to rate de-match the de-interleaved LLR sequences of the p segments; and the decoding unit is configured to separately perform SCL decoding on rate de-matched LLR sequences of the p segments, to obtain the decoding results of the p segments. Alternatively, the de-interleaving unit is configured to de-interleave the obtained LLR sequence; the rate matching unit is configured to separately rate de-match the p de-concatenated segments; and the decoding unit is configured to separately perform SCL decoding on rate de-matched LLR sequences of the p segments, to obtain the decoding results of the p segments.

According to a sixth aspect, in embodiments of this application, a computer-readable storage medium is provided, The computer-readable storage medium includes: an instruction for obtaining a log-likelihood ratio (LLR) sequence corresponding to to-be-decoded bits; an instruction for de-concatenating the LLR sequence if a coding parameter meets a preset segmentation condition, to obtain LLR sequences of p segments; an instruction for separately performing SCL decoding on the LLR sequences of the p segments, to obtain decoding results of the p segments; and an instruction for combining the decoding results of the p segments, and outputting a decoded bit sequence, where p is an integer greater than 1.

With reference to any one or any possible implementation of the first aspect to the sixth aspect, in an implementation, the segmentation condition is any one of the following: The coding parameter is a target code length M, and the target code length M is greater than a first threshold or the target code length is greater than or equal to a first threshold; or the coding parameter is K, wherein K is a length of the information bit sequence, and the K is greater than a second threshold or the length K of the to-be-encoded information bit is greater than or equal to a second threshold.

In a possible design, the first threshold is determined by at least one of a code rate R and the length K, and the first threshold $M_{segthr}$ is determined in any one of the following manners:

$$M_{segthr} = \frac{A}{R} + B,$$

$$M_{segthr} = \frac{CK}{K-D},$$

$$M_{segthr} = \frac{G}{R}, \text{ or}$$

$$M_{segthr} = \max\left(\left(\frac{A}{R} + B\right), \frac{G}{R}\right).$$

In a possible design, the second threshold is determined by at least one of the code rate R and the target code length M, and the second threshold $K_{segthr}$ is determined in any one of the following manners: $K_{segthr}=E\times R+F$, $K_{segthr}=G$, or $K_{segthr}=\max((E\times R+F), G)$.

Alternatively, in a possible design, the segmentation condition is $M\geq CK/(K-D)$ and $K\geq G$.

In the foregoing designs, A, B, C, D, E, F and G are constants.

In a possible design, A=160, B=1000, C=1000, D=160, E=1000, F=160, and G=360.

Alternatively, in a possible design, A=210, B=750, C=750, D=210, E=750, F=210, and G is a value in a range [300, 360].

Alternatively, in a possible design, A is a value in a range [150, 180], B is a value in a range [950, 1000], C is a value in the interval [950, 1000], D is a value in a range [150, 180], E is a value in the interval [950, 1000], F is a value in the interval [150, 180], and G is a value in a range [300, 360].

With reference to any one or any possible implementation of the first aspect to the sixth aspect, in an implementation, a concatenation manner is sequential concatenation or interlacing concatenation.

With reference to any one or any possible implementation of the first aspect to the sixth aspect, in an implementation, p=2, and the to-be-encoded information bit sequence is divided into two basically equal segments whose lengths are $K_1$ and $K_2$. In a design, $K_1=\text{ceil}(K/2)$, $K_2=K-K_1$, and ceil represents rounding up. In a design, if K is an even number, $K_1=K/2$ and $K_2=K/2$. If K is an odd number, $K_1=(K+1)/2$ and $K_2=(K-1)/2$, or $K_1=(K-1)/2$ and $K_2=(K+1)/2$. Alternatively, a determining manner may be represented as $K_1=(K+1)/2$ and $K_2=K-K_1$.

With reference to any one or any possible implementation of the first aspect to the sixth aspect, in an implementation, if the length of the to-be-encoded information bit sequence is an odd number, lengths obtained after the segmentation are $K_1$ and $K_2$, respectively, $|K_2-K_1|=1$, and a segment of a smaller length may be padded with 0 or 1, so that lengths of the two segments are the same.

With reference to any one or any possible implementation of the first aspect to the sixth aspect, in an implementation, target code lengths for encoding the two segments are $M_1$ and $M_2$, respectively, and $M_1$ and $M_2$ are basically equal. In a design, $M_1=\text{ceil}(M/2)$, $M_2=M-M_1$, and ceil represents rounding up. In a design, if M is an even number, $M_1=M/2$ and $M_2=M/2$. If M is an odd number $M_1=(M+1)/2$ and $M_2=(M-1)/2$, or $M_1=(M-1)/2$ and $M_2=(M+1)/2$.

According to a seventh aspect, in embodiments of this application, an encoding apparatus is provided. The encoding apparatus includes: at least one input end, configured to receive a to-be-encoded information bit sequence; a signal processor, configured to perform the encoding method in the first aspect and any possible implementation or design of the first aspect; and at least one output end, configured to output an encoded bit sequence obtained by the signal processor.

According to an eighth aspect, in embodiments of this application, an encoding apparatus is provided. The encoding apparatus includes: a memory, configured to store a program; and a processor, configured to: execute the program stored in the memory, and perform the encoding method in the first aspect and any possible implementation or design of the first aspect when the program is executed.

According to a ninth aspect, in embodiments of this application, a decoding apparatus is provided. The decoding apparatus includes: at least one input end, configured to receive log-likelihood ratios (LLR) corresponding to to-be-decoded bit; a signal processor, configured to perform the decoding method in the fourth aspect and any possible implementation or design of the fourth aspect; and at least one output end, configured to output a decoded bit sequence obtained by the signal processor.

According to a tenth aspect, in embodiments of this application, a decoding apparatus is provided. The decoding apparatus includes: a memory, configured to store a program; and a processor, configured to: execute the program stored in the memory, and perform the decoding method in the fourth aspect and any possible implementation or design of the fourth aspect when the program is executed.

According to an eleventh aspect, in embodiments of this application, a communication apparatus is provided. The communication apparatus includes: a bus, a processor, a storage medium, a bus interface, a network adapter, a user interface, and an antenna. The bus is connected to the processor, the storage medium, the bus interface, and the user interface. The processor is configured to perform the encoding method in the first aspect or any implementation or design of the first aspect, or is configured to perform the decoding method in the fourth aspect or any implementation or design of the fourth aspect. The storage medium is configured to store an operating system and to-be-sent or to-be-received data. The bus interface is further connected to the network adapter. The network adapter is configured to implement a signal processing function of a physical layer in a wireless communication network. The user interface is configured to be connected to a user input device. The antenna is configured to send and receive a signal.

Another aspect of this application provides a computer-readable storage medium, where the computer-readable storage medium stores an instruction, and when the computer-readable storage medium runs on a computer, the computer performs the encoding method in the first aspect or any implementation or design of the first aspect, or is configured to perform the decoding method in the fourth aspect or any implementation or design of the fourth aspect.

Another aspect of this application provides a computer program product including an instruction, where when the computer program product runs on a computer, the computer performs the encoding method in the first aspect or any implementation or design of the first aspect, or is configured to perform the decoding method in the fourth aspect or any implementation or design of the fourth aspect.

Another aspect of this application provides a computer program, where when the computer program runs on a computer, the computer performs the encoding method in the first aspect or any implementation or design of the first aspect, or is configured to perform the decoding method in the fourth aspect or any implementation or design of the fourth aspect.

In the embodiments of this application, if the coding parameter meets the preset condition, the to-be-encoded information bit sequence is segmented for separate encoding, so that a probability of using a repetition-based rate matching method is reduced, and a performance loss caused by repetition is reduced.

DESCRIPTION OF EMBODIMENTS

Figure 1:
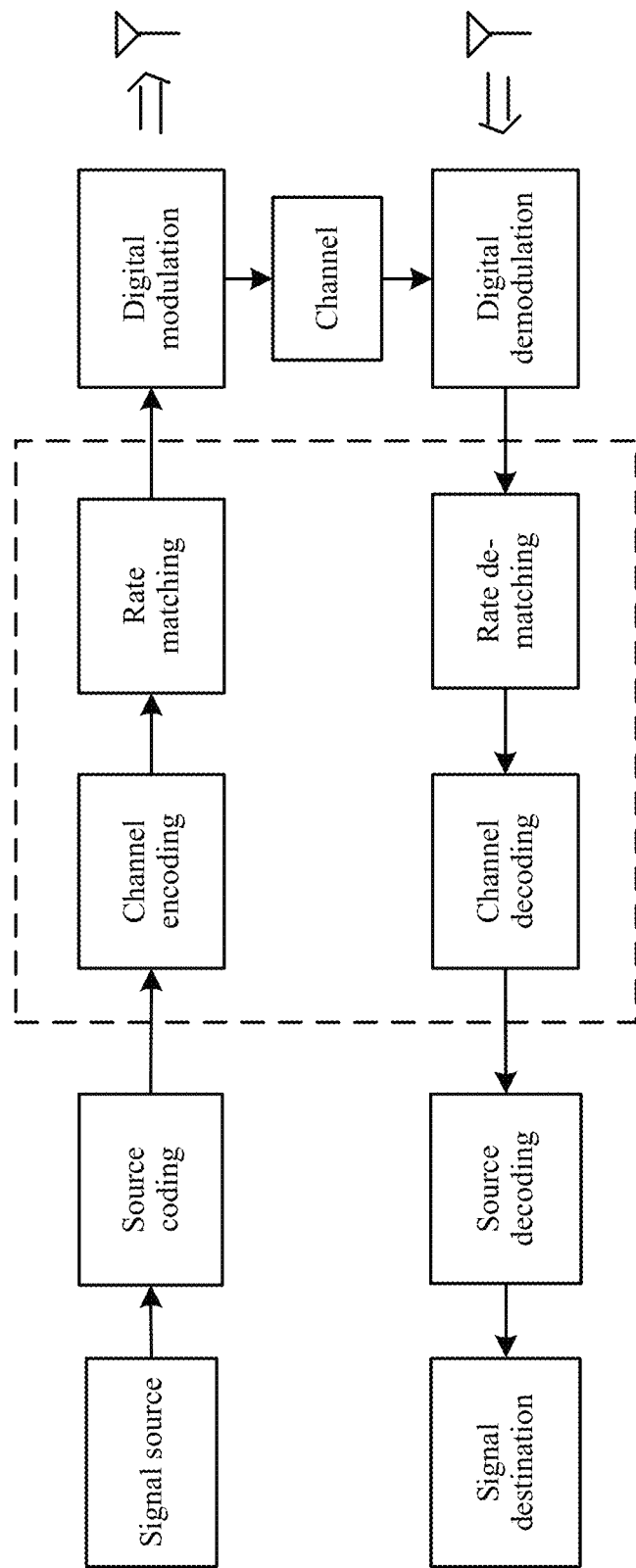
FIG. 1 is a schematic diagram of a basic wireless communication process between a transmitting end and a receiving end.

FIG. 1 shows a basic procedure of wireless communication. Communication signals are transmitted from a transmitting device (referred to as transmitting end hereinafter) to a receiving device (referred as receiving end hereinafter). At the transmitting end, a signal from a signal source is source encoded, channel encoded, rate matched, modulation mapped, and then transmitted to the receiving end. At the receiving end, after de-mapping demodulation, rate de-matching, channel decoding, and source decoding, the signal is output to a signal destination. In channel encoding and channel decoding, the polar coding process as described above can be used. Because a code length of an original polar code (mother code) is an integer power of 2, in practical applications, the code length may need to be adjusted to a different code length. This can be achieved through a process called rate matching. As shown in FIG. 1, at the transmitting end, the rate matching is performed after the channel encoding, to achieve any target code length. At the receiving end, a rate de-matching is performed before channel decoding, to restore the polar code to its original length.

In some cases, a mother code length is usually determined according to an agreed rule in a communication system. When the determined mother code length is greater than a target code length, a rate matching may be performed by using a shortening-based or a puncturing-based rate matching scheme. When the determined mother code length is less than the target code length, rate matching is performed by using a repetition-based rate matching scheme, but the repetition-based scheme causes a performance loss. A maximum mother code length used for a polar code is specified in some communication systems. For example, it is specified in a communication system that, a downlink maximum mother code length is 512 and an uplink maximum mother code length is 1024. Due to a limitation of maximum mother code length in polar code encoding, when a target code length is greater than $N_{max}$, repeated sending of a polar code whose code length is $N_{max}$ causes a performance loss, and the more the quantity of repeated bits, the greater the loss.

Under some conditions, segmentation-based encoding may be performed. This means that a code sequence is cut into several segments, each segment is encoded, and then encoding results are combined. Performance of the segmentation-based encoding is better than that of the repetition-based rate matching scheme. In this application, when coding parameters meet a preset condition, segmentation-based encoding is performed on to-be-encoded information bits, to reduce polar code performance loss caused by the existing repetition-based rate matching scheme. If a target code length M is less than a mother code length, polar encoding may be performed based on the mother code length N, to obtain an encoded bit sequence of the length N, and then an encoded bit sequence of the length M is obtained through puncturing or shortening.

Figure 2:
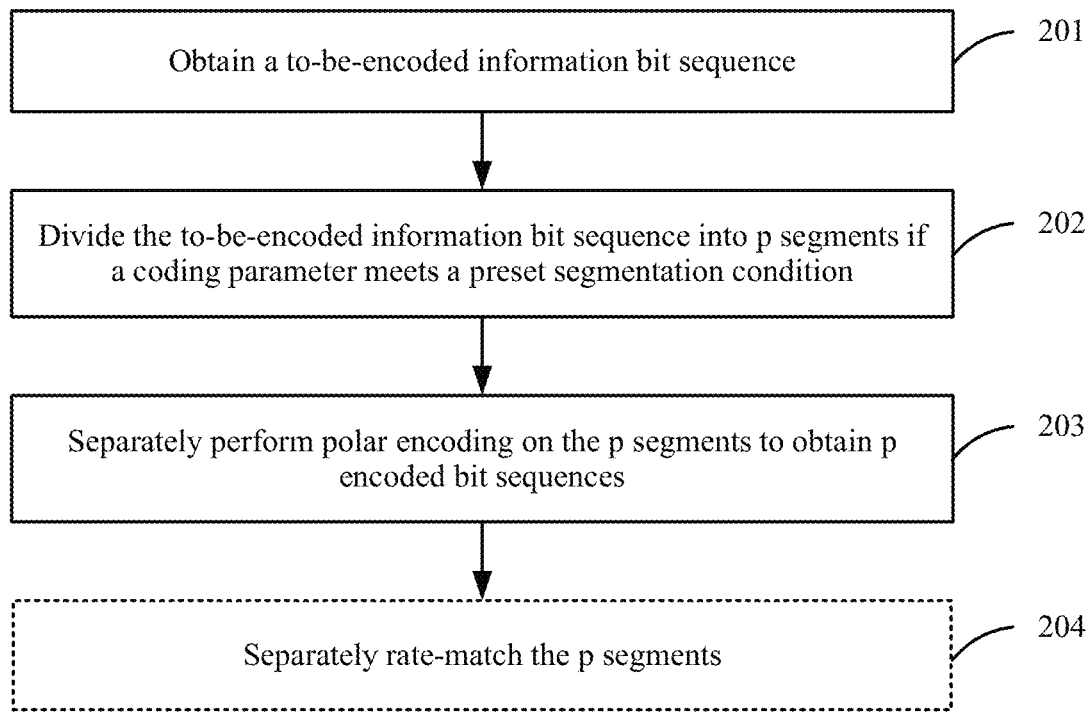
FIG. 2 is a flowchart of an encoding method according to an embodiment of this application.

FIG. 2 is a flowchart of an encoding method according to an embodiment of this application. The method includes the following steps.

201. Obtain a to-be-Encoded Information Bit Sequence.

Currently, polar coding methods include conventional Arikan polar coding and checked polar coding. The checked polar coding includes cyclic redundancy check (CRC) concatenated polar coding, parity check (PC) concatenated polar coding, and PC-aided CRC concatenated polar coding.

In CRC concatenated polar coding, firstly a CRC is performed on an information bit set, and then polar encode is performed. In PC concatenated polar coding, a PC is firstly performed on an information bit set, and then polar encode is performed. In PC-aided CRC concatenated polar coding, a PC-aided CRC is performed on an information bit set, and then polar encode is performed.

Polar coding and decoding methods and polar coding and decoding apparatuses in embodiments of this application may use the conventional polar coding, CRC-aided (CA) polar coding, or the PC polar coding scheme. These check manners mentioned above applied in the polar coding leads to a performance improvement during polar encoding.

The to-be-encoded information bit sequence described in this application may be an information bit sequence that is actually to be sent in a communication system, or may be a bit sequence obtained after information bits are concatenated with CRC bits. Therefore, a length K may represent a quantity of to-be-sent information bits, or may represent a quantity of all bits that are to be mapped to information bit locations during polar code encoding. Using the CA-polar code as an example, K may be a value including a CRC length, or may be a value that does not include a CRC length; and may be flexibly defined in specific applications.

202. Divide the to-be-encoded information bit sequence into p segments if a coding parameter meets a preset segmentation condition (which may also be referred to as a segmentation-based encoding condition), where p is an integer greater than 1.

To ensure performance after segmentation, the to-be-encoded information bit sequence of the length K may be equally segmented. For example, if p=2, the to-be-encoded information bit sequence is divided into two basically equal length segments whose lengths are $K_1$ and $K_2$, respectively. $K_1$ and $K_2$ are calculated in a plurality of manners. For example, $K_1$=ceil(K/2), $K_2$=K−K1, and ceil represents rounding up. If K is an even number, $K_1$=$K_2$=K/2 may be set. If K is an odd number, $K_1$ and $K_2$ that are obtained after the segmentation are different, and a difference between the two segments is 1 bit. That is, $K_1$=(K+1)/2 and $K_2$=(K−1)/2, or $K_1$=(K−1)/2 and $K_2$=(K+1)/2. In this case, a smaller segment may be padded with one bit of 0 or 1, and the padding location may be in a head or a tail of the segment, so that $K_1$=$K_2$. Therefore, a same rate matching manner may be used for both segments. A padding bit at a corresponding padding location is removed after decoding. Certainly, padding may not be performed, and rate matching may be separately performed on the two segments. $M_1$ and $M_2$ are target code lengths for encoding the two segments, and $M_1$ and $M_2$ are basically the same. $M_1$ and $M_2$ are determined in a plurality of manners. For example, $M_1$=ceil(M/2), $M_2$=M−$M_1$, and ceil represents rounding up. If M is an even number, $M_1$=$M_2$=M/2. If M is an odd number, $M_1$=(M+1)/2 and $M_2$=(M−1)/2 may be set, or $M_1$=(M−1)/2 and $M_2$=(M+1)/2 may be set.

For the polar code, when the segmentation condition is met, the to-be-encoded information bit sequence is divided into p segments. The to-be-encoded information bit sequence may be divided into the p segments at one time, or may be divided into segments at a time, and if a segment meets the segmentation condition, a further segmentation on the segment is performed. A specific quantity of segments that are obtained after segmentation and whether to continue to divide the segments may be flexibly designed based on actual applications. In some embodiments, it is specified that the to-be-encoded information bit sequence is divided into a maximum of two segments.

The segmentation condition of the polar code may be as follows:

$$M \geq M_{segthr} = f(R,K), \text{ or}$$

$$M > M_{segthr} = f(R,K).$$

That is, the threshold $M_{segthr}$ for the segmentation condition is related to one or both of code rate R and information bit sequence length K. For example, the segmentation condition is $$M \geq \frac{A}{R} + B$$

or an equivalent form $$M \geq \frac{CK}{K-D}.$$

A specific example may be or $$M \geq \frac{160}{R} + 1000 \text{ or } M \geq \frac{1000K}{K-160}.$$

Alternatively, the segmentation condition of the polar code may be as follows:

$$K \geq K_{segthr} = f(R,M), \text{ or}$$

$$K > K_{segthr} = f(R,M).$$

That is, the threshold $K_{segthr}$ for the segmentation condition is related to one or both of R and M. For example, the segmentation condition is K≥E×R+F. A specific example may be K≥1000×R+160.

In the foregoing formulas, A, B, C, D, E, and F are constants.

Alternatively, another condition may be added to the foregoing form, and an intersection of the foregoing form and the other condition is used as a segmentation condition. For example, the segmentation condition is $$M \geq \max\left(\left(\frac{A}{R}+B\right), \frac{G}{R}\right),$$

or an equivalent form $$M \geq \frac{CK}{K-D}$$

and K≥G A specific example may be $$M \geq \max\left(\left(\frac{160}{R}+1000\right), \frac{360}{R}\right), \text{ or } M \geq \frac{1000K}{K-160}$$

and K≥360.

Alternatively, the segmentation condition may be:

$$K \geq \max((E \times R+F),G).$$

A specific example may be K≥1000×R+160, and K≥360.

In the segmentation condition in this application, if "greater than or equal to" (≥) is replaced with "greater than", the segmentation condition is still applicable.

That is, the segmentation condition may be at least one of the following:

The coding parameter is a target code length M, and the target code length M is greater than a first threshold or the target code length is greater than or equal to a first threshold; or the coding parameter is the length K, and the length K is greater than a second threshold or the length K of the to-be-encoded information bit is greater than or equal to a second threshold.

The first threshold is determined by at least one of a code rate R and the length K. For example, the first threshold $M_{segthr}$ is determined in any one of the following manners:

$$M_{segthr} = \frac{A}{R} + B,$$

$$M_{segthr} = \frac{CK}{K-D},$$

$$M_{segthr} = \frac{G}{R}, \text{ or}$$

$$M_{segthr} = \max\left(\left(\frac{A}{R}+B\right), \frac{G}{R}\right).$$

The second threshold is determined by at least one of the code rate R and the target code length K. For example, the second threshold $K_{segthr}$ is determined in any one of the following manners: $K_{segthr}=E \times R+F$, $K_{segthr}=G$, or $K_{segthr}=\max((E \times R+F),G)$.

Alternatively, the segmentation condition may be determined by both the coding parameters M and K. For example, the segmentation condition is $$M \geq \frac{CK}{K-D}$$

and $K \geq G$ Certainly, the segmentation condition may be $$M > \frac{CK}{K-D}$$

and $K>G$.

A, B, C, D, E, F, and G are constants, and max is a max function.

In an embodiment, values of A, B, C, D, E, F, and G are shown in the following Table 1.

TABLE 1

| A | B | C | D | E | F | G |
|---|---|---|---|---|---|---|
| 160 | 1000 | 1000 | 160 | 1000 | 160 | 360 |

Alternatively, in an embodiment, values of A, B, C, D, E, F, and G are shown in the following Table 2, and G is a value in a range [300, 360] (including two endpoints of the range).

TABLE 2

| A | B | C | D | E | F | G |
|---|---|---|---|---|---|---|
| 210 | 750 | 750 | 210 | 750 | 210 | 300-360 |

Alternatively, in an embodiment, values of A, B, C, D, E, F, and G are respectively values in ranges (including two endpoints of the ranges) shown in the following Table 3.

TABLE 3

| A | B | C | D | E | F | G |
|---|---|---|---|---|---|---|
| 150-180 | 950-1000 | 950-1000 | 150-180 | 950-1000 | 150-180 | 300-360 |

Step 203: Separately perform polar encoding on the p segments to obtain p encoded bit sequences.

The p segments are separately encoded to obtain the p encoded bit sequences. A total length of the information bit sequence is K, and information bit lengths of the p segments are $K_1, K_2, \ldots,$ and $K_p$, respectively, where $K=K_1+K_2+\ldots+K_p$.

Specifically, target code lengths for separately performing polar encoding on the p segments are $M_1, M_2, \ldots,$ and $M_p$, respectively, where $M=M_1+M_2+\ldots+M_p$, and M is the target code length for encoding the information bit sequence. For an encoding and rate matching manner of each segment, refer to the existing manners. Specifically, mother code lengths $N_1, N_2, \ldots,$ and $N_p$ used to encode all the segments are determined based on $M_1, M_2, \ldots,$ and $M_p$, and polar encoding is performed on each segment.

For each Mi, where $i=1, 2, \ldots, p$, when $M_i > N_i$, the mother code length $N_i$ is used to perform polar encoding on a segment corresponding to $K_i$, to obtain an encoded bit sequence of the length $N_i$, and a repetition-based rate matching manner is subsequently used. When $M_i < N_i$, the mother code length $N_i$ is used to encode a segment corresponding to $K_i$, to obtain an encoded sequence of the length $N_i$, and a shortening- or puncturing-based rate matching scheme is subsequently used.

There are a plurality of manners of determining a mother code length N, and the following describes three manners:

Manner (1): If a maximum mother code length $N_{max}$ is specified in a communication system, when $M > N_{max}$ (or $M \geq N_{max}$), it is determined to use a repetition-based rate matching scheme, and $N=N_{max}$. When $M < N_{max}$ (or $M \leq N_{max}$), it is determined to use a shortening- or puncturing-based rate matching scheme, to obtain an encoded bit sequence of the length M, that is, M is rate matching output sequence length, where $N=2^{\lceil \log_2 M \rceil}$, and $\lceil \cdot \rceil$ represents rounding up to next integer.

Manner (2): A value suitable for a repetition-based rate matching scheme is preferentially selected as N, that is, a value of N that is less than a target code length and that meets that a code rate is less than (or less than or equal to) a code rate threshold Rmin is selected. If a value of N that meets the condition is not found, a value of N for shortening or puncturing is selected. Usually, the value is $N=2^{\lceil \log_2 M \rceil}$.

The code rate threshold may be set to ⅛, ⅙, ¼, or the like. The code rate R may be calculated in two manners. One manner is R=K/N, and the other manner is R=K/M. R=K/N is used as an example. Assuming that the code rate threshold is ¼, M=288, K=40, and a value of N meeting that K/N is less than ¼ is 256, N=256 is selected. If K=80, and a value of N that is 2 raised to the integer power, that is less than or equal to 256, and that can meet that 80/N is less than or equal to ¼ cannot be found, it may be determined that $N=2^{\lceil \log_2 M \rceil}=512$.

Manner (3): A value that is less than a target code length and that meets $M \leq N \times (1+\delta)$ is preferentially selected as N, or $N=2^{\lceil \log_2 M \rceil}$ is selected otherwise, where $\lceil \cdot \rceil$ represents rounding up to next integer. $\delta$ may be a constant, for example, is set to ⅛, ¼, or ⅜. Alternatively, $\delta$ may be a value related to a code rate of a mother code, $\delta=\text{FUNCTION}(R_0)$, $R_0=K/N$, K is a length of an information block, and $\delta$ usually decreases with increase of $R_0$. A function of $\delta$ with respect to the code rate R may be designed as $\delta=\beta \times (1-R_0)$, where $\beta$ is a preset constant. For example, $\beta$ may be ½, ⅜, ¼, ⅛, or 1/16. That is, $\delta$ is a linear function with respect to $R_0$. Larger $R_0$ leads to smaller $\delta$, that is, a smaller quantity of bits are allowed to be repeated. A function of $\delta$ with respect to the code rate R may be designed as $\delta=\beta \times (1-R_0)^2$, where $\beta$ is a constant. For example, $\beta$ may be ½. That is, $\delta$ is a quadratic function with respect to $R_0$. Larger $R_0$ leads to smaller $\delta$, that is, a smaller quantity of bits are allowed to be repeated.

The three manners are applicable to selection of a mother code length of a to-be-encoded information bit sequence, and are also applicable to selection of mother code lengths of segments obtained after segmentation. Alternatively, a minimum value may be selected, as a final value of N, from values of N determined in any two or three of the foregoing manners. If $N=2^n$, in an embodiment, $n=\min\{n_1, n_2, n_{max}\}$, where $n_1$, $n_2$, and $n_{max}$ are separately determined in the following manner:

If $E<(9/8) \times 2^{(\lceil \log_2 E \rceil - 1)}$ and $K/M<9/16$, $n_1=\lceil \log_2 E \rceil -1$; otherwise, $n_1=\lceil \log_2 E \rceil$.

$n_2=\lceil \log_2(K/R_{min}) \rceil$, and $R_{min}=1/8$.

$n_{max}=\log_2 N_{max}$.

After step 203, the method may further include the following step:

204. Separately rate-match the p segments.

Specifically, if a target code length $M_i$ of each segment is greater than a mother code length $N_i$, at least some bits in an encoded bit sequence of the length $N_i$ are repeated, to obtain an encoded bit sequence of the length $M_i$. If a target code length $M_i$ of each segment is less than or equal to a mother code length $N_i$, a puncturing- or shortening-based rate matching scheme is used to delete a coded bit at a puncturing location or a shortening location, to obtain an encoded bit sequence of the length $M_i$.

All encoded bit sequences obtained after the rate matching need to be concatenated, to obtain an encoded bit sequence of the length M. After the polar encoding, there is an interleaving process in addition to the rate matching. The concatenation may be performed before the interleaving, or may be performed after the interleaving. A concatenation manner may be sequential concatenation or interlacing concatenation.

To ensure performance in higher order modulation and a fading channel, a channel interleaver is designed (for an uplink channel or a downlink channel) after rate matching. To improve a decoding success rate of a segmented polar code in a fading channel, especially when one segment is severely faded, two segments of the polar code may be combined in an interlacing concatenation manner after being encoded. This ensures that the two segments pass through an approximately same channel. After the interlacing concatenation, the two segments have same modulation bit reliability, and an original interleaving depth can be maintained.

Figure 3:
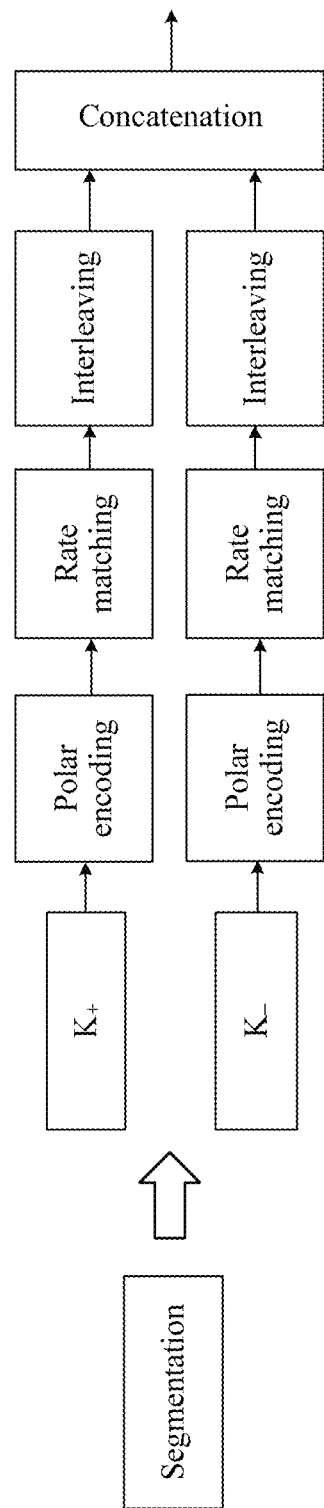
FIG. 3 is a flowchart of an encoding method according to an embodiment of this application.
Figure 4:
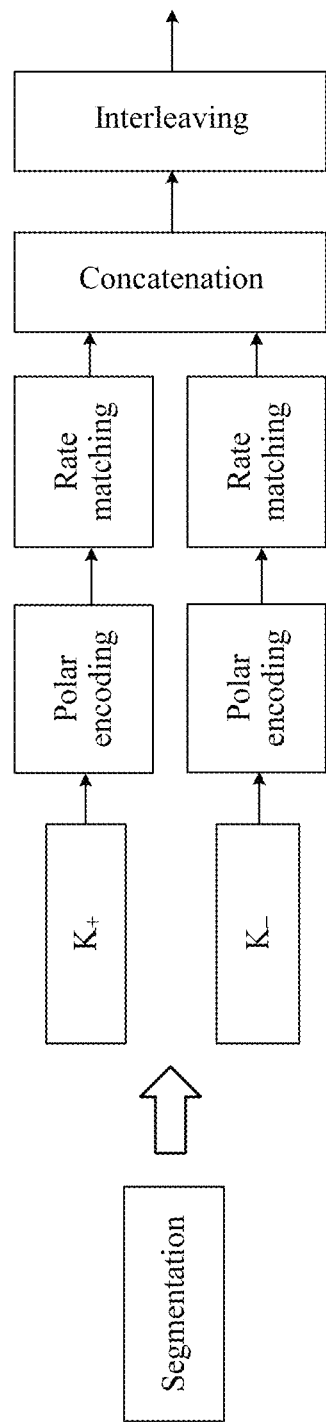
FIG. 4 is a flowchart of a segmentation-based encoding method according to an embodiment of this application.

FIG. 3 and FIG. 4 are schematic diagrams of segmentation-based encoding processes. For example, two segments (a segment 0 and a segment 1) are obtained through division, and K includes a CRC length. That is, before the segmentation shown in FIG. 3 and FIG. 4, a CRC adding process was included (not shown in the figure). In FIG. 3, after rate matching, the two segments are separately interleaved; then the two segments are concatenated, and then transmitted by using a channel. The concatenation is performed after the interleaving, so that performance of the existing interleaver is not destroyed. A concatenation manner may be sequential concatenation or interlacing concatenation.

In FIG. 4, after rate matching, the two segments are first concatenated, and then a concatenated sequence is interleaved. This manner requires only one interleaver, and therefore is easy to implement. Similarly, a segment concatenation manner may be sequential concatenation or interlacing concatenation.

In FIG. 3 and FIG. 4, $K_+$ and $K_-$ represent lengths of the two segments (the segment 0 and the segment 1) obtained through division, and target code lengths corresponding to the two segments may be denoted as $M_+$ and $M_-$. The lengths $K_+$ and $K_-$ and the target code lengths $M_+$ and $M_-$ are equivalent to the lengths $K_1$ and $K_2$ described above and the target code lengths $M_1$ and $M_2$ described above, except that they are marked by using different symbols. During actual application, other marks may be used. For example, $K_0$ and $K_1$ represent the lengths of the segment 0 and the segment 1, and $M_0$ and $M_1$ represent the target code lengths corresponding to the two segments.

The sequential concatenation indicates that bits of the segment 0 and bits of the segment 1 are sequentially combined into a sequence. Bits of the encoded and rate matching output segment 0 are denoted as $a_0, a_1, \ldots, a_{M0-1}$, and bits of the encoded and rate matching output segment 1 are denoted as $b_0, b_1, \ldots, b_{M1-1}$. In this case, bits obtained after sequential concatenation are $a_0, a_1, \ldots, a_{M0-1}, b_0, b_1, \ldots, b_{M1-1}$.

Figure 18:
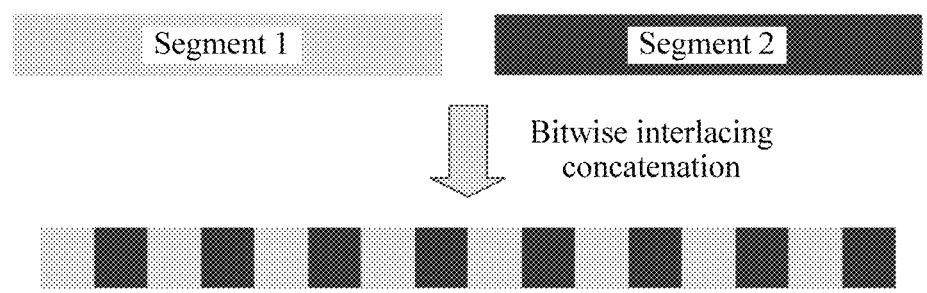
FIG. 18 is a schematic diagram of bit-level interlacing concatenation according to an embodiment of this application.

The interlacing concatenation indicates that bits of the segment 0 and bits of the segment 1 are combined into a sequence through interlacing according to a predetermined rule. An interlacing concatenation rule may be represented in various manners. Bitwise interlacing concatenation (bitwise interlacing concatenation) indicates that combination is performed through interlacing on a per-bit basis. As shown in FIG. 18, bits obtained after bitwise interlacing concatenation are $a_0, b_0, a_1, b_1, \ldots, a_{M0-1}, b_{M1-1}$.

Coded bits of each segment are denoted as $e_{rk}$, where r is a segment sequence number, $r=0, \ldots, p-1$, p is a quantity of segments obtained through division, $k=0, \ldots, E-1$, and E is a quantity of bits of a segment r. In this case, coded bits obtained after concatenation are $f_k$, where $k=0, \ldots, G-1$, and G is a quantity of coded bits obtained after concatenation. An implementation of the bitwise interlacing concatenation may be represented as follows by using pseudocode:

```
Set k = 0 and j = 0
while j < E
    Set r = 0
    while r < p
        f_k = e_rj
        k = k + 1
        r = r + 1
    end while
    j = j + 1
end while
```

If p=2, that is, two segments are obtained through division, a segment 0 is represented as $v_k^{(0)}$, and a segment 1 is represented as $v_k^{(1)}$, where $k=0, \ldots, M/2$, and coded bits obtained after concatenation are represented as w, an implementation of the bitwise interlacing concatenation may be represented as follows by using pseudocode:

$$w_{2k} = v_k^{(0)}, k=0, \ldots, M/2$$

$$w_{2k+1} = v_k^{(1)}, k=0, \ldots, M/2$$

Alternatively, the interlacing concatenation manner may be related to a modulation order. For example, an interlacing interval may be a modulation order. This implements interlacing concatenation at a level of a modulation symbol.

If a modulation scheme is binary phase shift keying (BPSK), a modulation order is 1, and bits obtained after interlacing concatenation may be $a_0, b_0, a_1, b_1, \ldots, a_{M0-1}, b_{M1-1}$. If a modulation scheme is quadrature phase shift keying (QPSK), a modulation order is 2, and every 2 bits are modulated into one symbol. Bits obtained after interlacing concatenation at intervals of 2 bits may be $a_0, a_1, b_0, b_1, \ldots, a_{M0-2}, a_{M0-1}, b_{M1-2}, b_{M1-1}$. This implements interlacing at a level of a single modulation symbol: $S_{a0}, S_{b0}, S_{a2}, S_{b2}, \ldots$, where $S_{ai}$ represents a symbol obtained after a segment 0 is modulated, and $S_{bi}$ represents a symbol obtained after a segment 1 is modulated. Alternatively, bits obtained after interlacing concatenation may be $a_0, a_1, a_2, a_3, b_1, b_2, b_3, b_4, \ldots, a_{M0-4}, a_{M0-3}, a_{M0-2}, a_{M0-1}, b_{M1-4}, b_{M1-3}, b_{M1-2}, b_{M1-1}$. This implements interlacing at a level of two modulation symbols: $S_{a0}, S_{a1}, S_{b0}, S_{b1}, \ldots$. Alternatively, interlacing concatenation may be performed at a level of a larger quantity of modulation symbols.

If a modulation scheme is 16 quadrature amplitude modulation (QAM), a modulation order is 4, and bits obtained after interlacing concatenation may be $a_0, a_1, a_2, a_3, b_0, b_1, b_2, b_3, \ldots, a_{M0-4}, a_{M0-3}, a_{M0-2}, a_{M0-1}, b_{M1-4}, b_{M1-3}, b_{M1-2}$, $b_{M1-1}$. Alternatively, interlacing concatenation is performed at a level of a larger quantity of modulation symbols.

If a modulation scheme is 64QAM, a modulation order is 6, and bits obtained after interlacing concatenation may be $a_0, a_1, a_2, a_3, a_4, a_5, b_0, b_1, b_2, b_3, b_4, b_5, \ldots, a_{M0-6}, a_{M0-5}, a_{M0-4}, a_{M0-3}, a_{M0-2}, a_{M0-1}, b_{M1-6}, b_{M1-5}, b_{M1-4}, b_{M1-3}, b_{M1-2}, b_{M1-1}$. Alternatively, interlacing concatenation is performed at a level of a larger quantity of modulation symbols.

The interlacing concatenation in this embodiment of this application may be implemented by using a row-column interleaver.

The segmentation action in step 202 is not necessarily required, and the segments may be obtained through division in advance. Therefore, alternatively, the encoding method in this embodiment of this application may include: obtaining a to-be-encoded information bit sequence, where the to-be-encoded information bit sequence includes p segments, and a coding parameter for the polar encoding meets a preset segmentation condition; and separately performing polar encoding on the p segments to obtain p encoded bit sequences, where p is an integer greater than 1. A sequence and method of performing rate matching, interleaving, and concatenation on the p encoded bit sequences are the same as those described above.

Figure 2A:
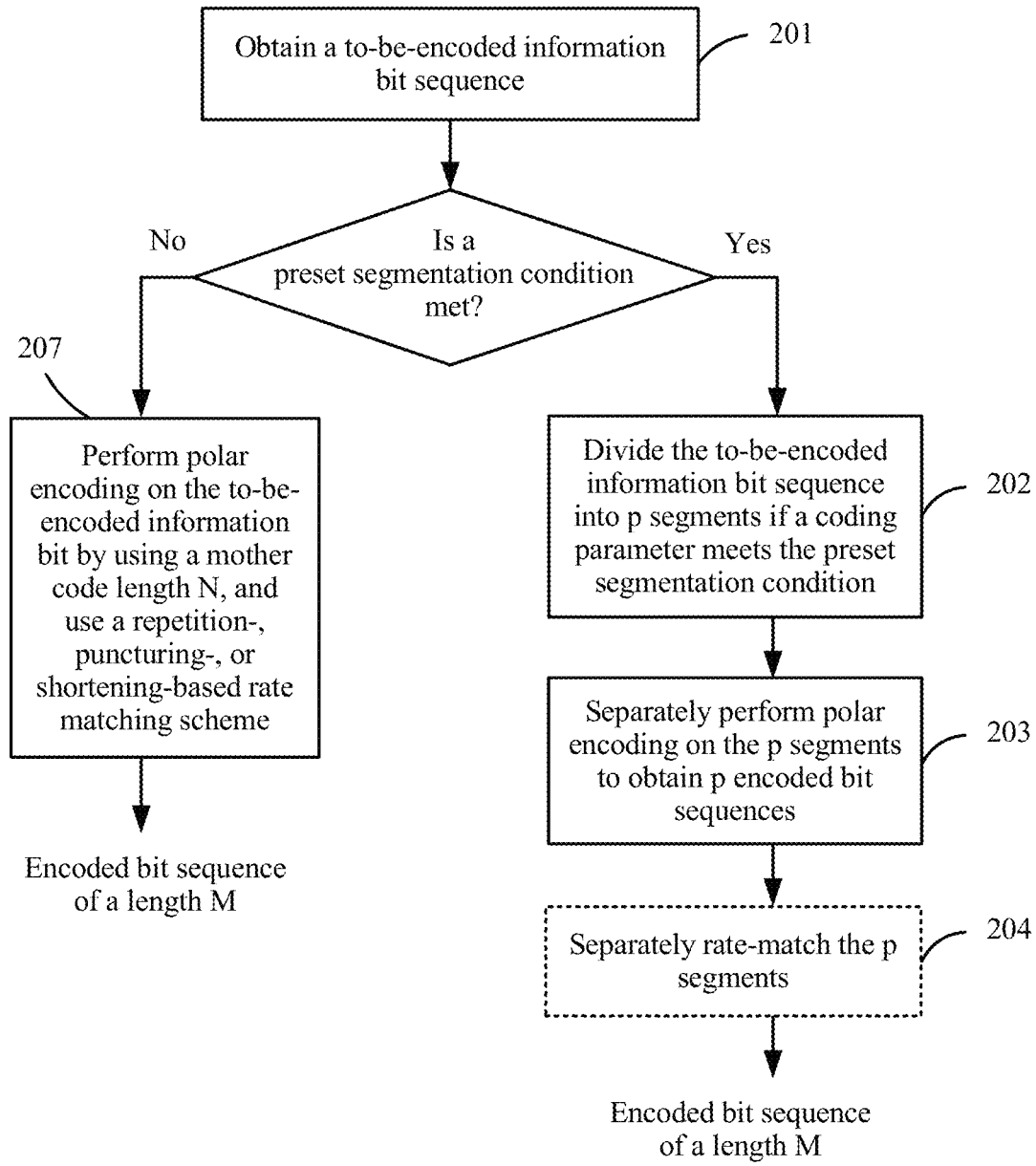
FIG. 2A is a flowchart of an encoding method according to another embodiment of this application.

As shown in FIG. 2A, in another embodiment, if the coding parameter does not meet the preset segmentation condition, segmentation-based encoding is not performed. Instead, a mother code length N and a corresponding rate matching manner are determined in an existing manner, and step 207 is performed. Step 207: Perform polar encoding on the to-be-encoded information bit by using a mother code length N, and use a repetition-, puncturing-, or shortening-based rate matching scheme.

Figure 5:
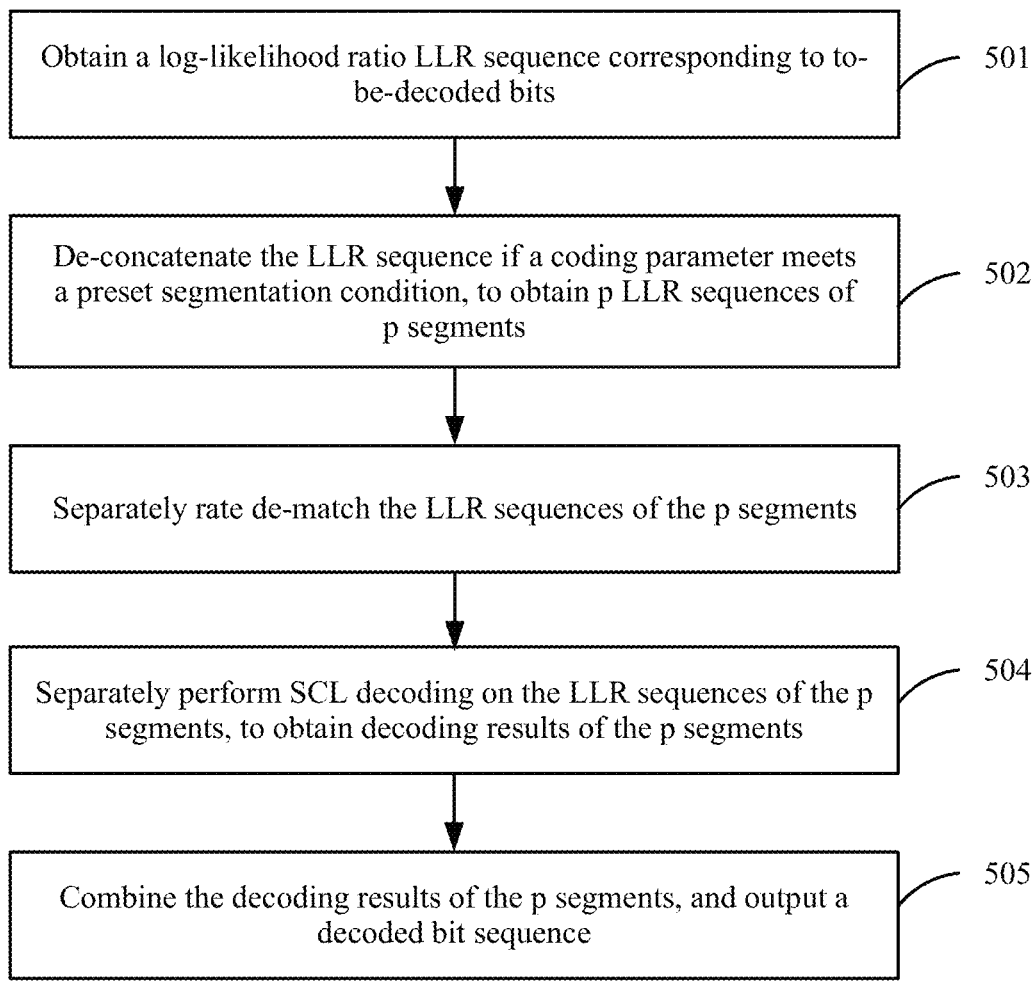
FIG. 5 is a flowchart of a decoding method according to an embodiment of this application.

FIG. 5 is a flowchart of a decoding method according to an embodiment of this application. The method includes the following steps.

501. Obtain a log-likelihood ratio (LLR) sequence corresponding to to-be-decoded bits.

When receiving an encoded bit sequence sent by an encoder, a decoder obtains the log-likelihood ratio LLR sequence corresponding to the to-be-decoded bits.

502. De-concatenate the LLR sequence if a coding parameter meets a preset segmentation condition, to obtain LLR sequences of p segments.

Corresponding to the encoder, if the encoder uses segmentation-based encoding, the decoder uses a segmentation-based decoding method. The de-concatenation refers to dividing the LLR sequence into p segments in a manner reverse to that of concatenation of the encoder, where p is an integer greater than or equal to 2, lengths of the p segments are $M_1, M_2, \ldots,$ and $M_p$, respectively, and $M = M_1 + M_2 + \ldots + M_p$.

If the encoder uses a rate matching manner, the decoding method may further include rate de-matching. For details, refer to step 503.

503. Separately rate de-match the p segments obtained through division in step 502. Specifically, mother code lengths $N_1, N_2, \ldots,$ and $N_p$ of all the segments are separately determined. A mother code length N of each segment and a corresponding rate matching manner are determined according to an agreed rule. A specific method is consistent with that used by the encoder. For the method, refer to the three manners described in step 202 in the procedure.

For each $M_i$, where $i=1, 2, \ldots, p$, when $M_i > N_i$, it is determined that a transmitting end performs rate matching in a repetition manner. In this case, LLRs at repetition locations are combined to obtain a rate matching output LLR sequence of the length $N_i$. When $M_i \leq N_i$, it is determined that a transmitting end performs rate matching in a shortening or puncturing manner. In this case, an LLR at a shortening or puncturing location is restored (set to an agreed fixed value), to obtain a rate matching output LLR sequence of the length $N_i$.

504. Separately perform successive cancellation list (SCL) decoding on the p segments, to separately obtain decoding results of the p segments. Specifically, SCL decoding is performed based on rate matching output LLRs of the p segments, to obtain the p decoding results.

505. Combine the decoding results, of the p segments, that are obtained in step 504, and output a final decoded bit sequence.

Optionally, after the p segments are obtained through division in step 502, each of the p segments whose coding parameter meets the preset condition is further divided into p segments, and then rate matching and decoding are separately performed on the p segments to obtain decoding results of the p segments, and the decoding results of the p segments are combined.

According to the encoding method and the decoding method in the embodiments of this application, the p segments may be equal segments. For example, if a total length of a to-be-encoded bit sequence is K, a length of each segment is K/p, and correspondingly, a target code length of each segment is M/p. If K and M are indivisible, K and M are slightly adjusted. This is specifically corresponding to a case of the encoder. Depending on different types of polar encoding methods, a to-be-encoded information bit sequence may include only a to-be-encoded information bit sequence, or may include an information block and a CRC bit.

Figure 6:
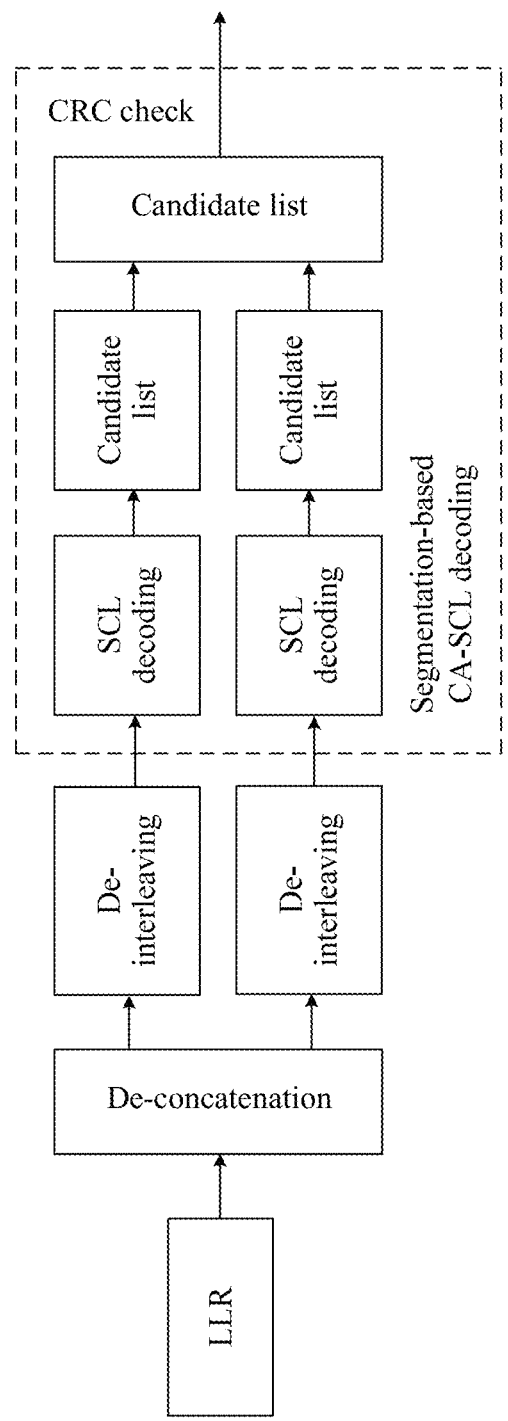
FIG. 6 is a flowchart of a segmentation-based decoding method according to an embodiment of this application.
Figure 7:
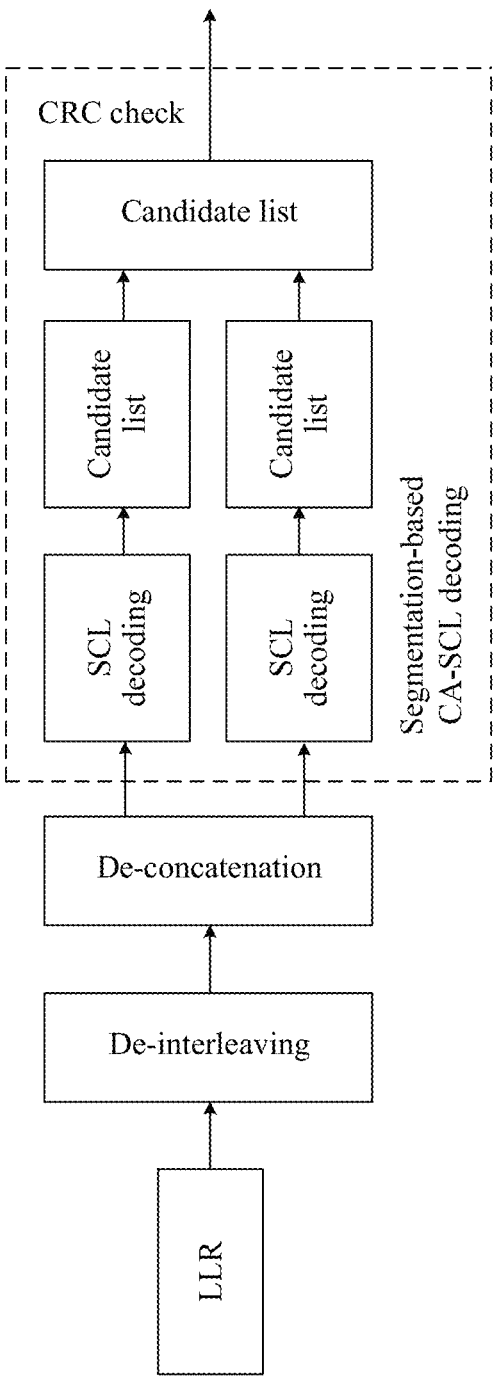
FIG. 7 is a flowchart of another segmentation-based decoding method according to an embodiment of this application.

If the encoder has an interleaving process, a decoder has a de-interleaving process. A process and sequence of de-concatenation and de-interleaving are reverse to those of concatenation and interleaving of the encoder. In an example, as shown in FIG. 6, CA-SCL decoding and p=2 are used as an example. An LLR sequence is first de-concatenated to obtain two segments, and then de-interleaving is separately performed on the two segments. Optionally, rate de-matching (not shown in the figure) is further performed after the de-interleaving, and then SCL decoding is separately performed on the two segments. A decoding result (candidate list) of each segment is output, decoding results of the two segments are combined, and a CRC check is performed on a combined decoding result to obtain a final decoding result. As shown in FIG. 7, de-interleaving is first performed, and then the de-interleaved LLR sequence is de-concatenated, to obtain two segments. Optionally, rate de-matching (not shown in the figure) is further performed after the de-concatenation, and then SCL decoding is separately performed on the two segments. A decoding result (candidate list) of each segment is output, decoding results of the two segments are combined, and a CRC check is performed on a combined decoding result to obtain a final decoding result. The de-concatenation is a process reverse to concatenation. For details, refer to the content described in the encoding method.

In this application, the described "if M is greater than a mother code length N" may be represented by using an equivalent manner: "if $2^{\lceil \log_2 M \rceil}$ is greater than a mother code length N". Because the mother code length is 2 raised to the integer power, in terms of effects, "$2^{\lceil \log_2 M \rceil}$ is greater than a mother code length N" inevitably leads to "M is greater than a mother code length N". Reversely, if "M is greater than a mother code length N", it can be inevitably derived that "$2^{\lceil log_2 M \rceil}$ is greater than a mother code length N". $\lceil \cdot \rceil$ represents rounding up to next integer.

Figure 8:
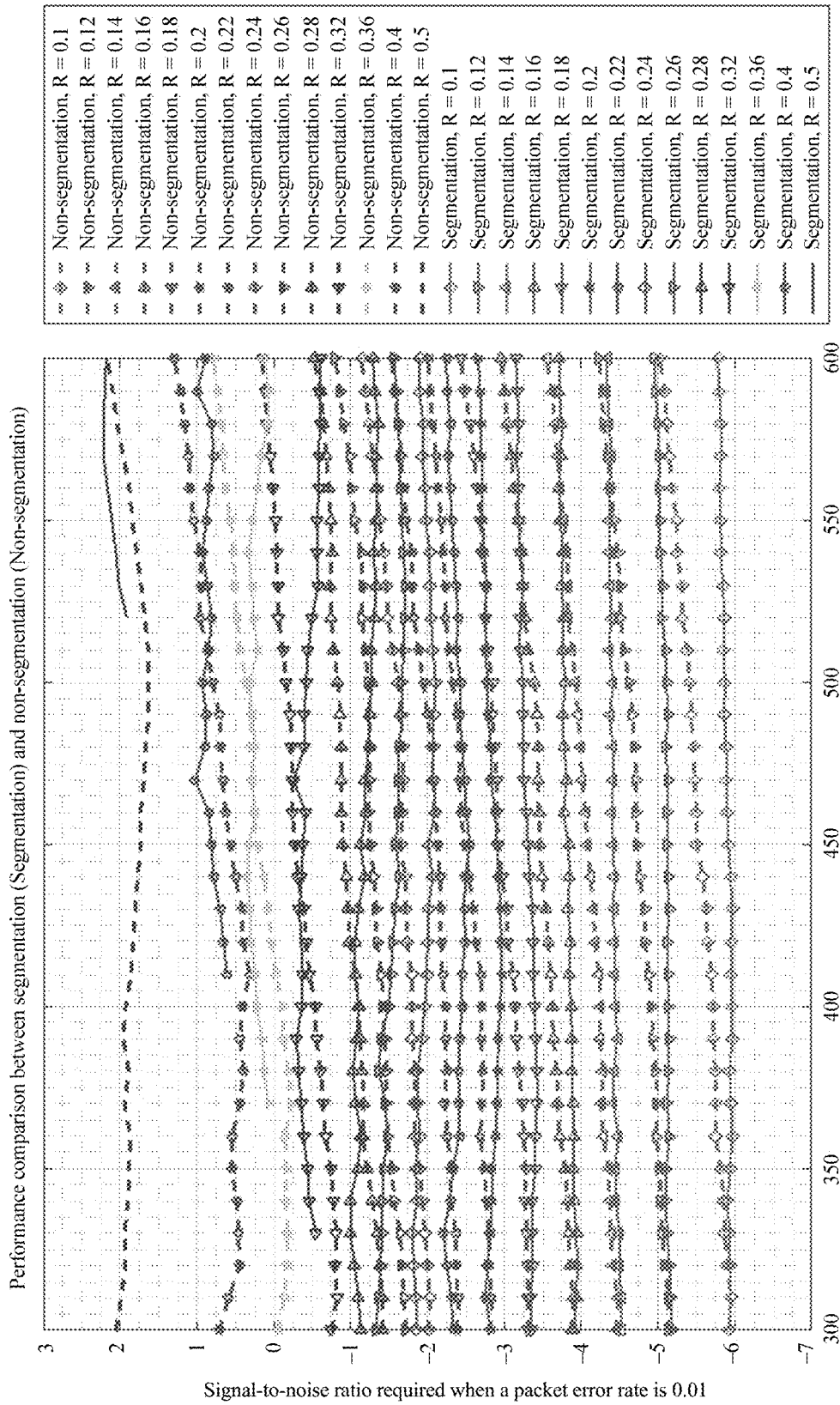
FIG. 8 is a diagram of simulation performance comparison between a segmentation-based encoding method and a non-segmentation-based encoding method during decoding.

FIG. 8 is a schematic diagram of decoding performance comparison between CA-polar encoding and segmentation-based CA-polar encoding at different code rates. In FIG. 8, a solid line represents decoding performance of using the segmentation-based CA-Polar encoding, and a dashed line represents decoding performance of using normal CA-Polar encoding. In FIG. 8, in a vertical axis direction, a curve closer to a horizontal axis corresponds to a smaller value of the code rate R. It can be learned that, at a same code rate, the decoding performance of the segmentation-based encoding is better than the decoding performance of the normal CA-Polar encoding. Parameters of simulation results are shown in Table 4.

TABLE 4

Simulation Parameters

| | |
|---|---|
| Channel | Additive White Gaussian Noise (AWGN) |
| Modulation scheme | QPSK |
| CRC length | 11 |
| Segmentation manner | Equal segmentation: $K_{seg}$ = ceil(K/2) and $M_{seg}$ = ceil(M/2) |
| Decoding parameter | Non-segmentation-based decoding: CA-SCL decoding, where list = 8. Segmentation-based decoding: SCL decoding, where list = 8, and a CRC check is performed on eight combined optimal paths |
| K (including a CRC) | 300:10:600 (from 300 to 600 at intervals of 10) |
| Code rate (R = K/M) | 0.1:0.02:0.28, 0.32:0.04:0.4, 0.5 (from 0.1 to 0.32 at intervals of 0.02; from 0.32 to 0.4 at intervals of 0.04; 0.5) |
| $N_{max}$ | 1024 |

The puncturing described in the embodiments of this application includes quasi-uniform puncturing (QUP). It is first determined that a mother code length is 2 raised to the integer power and is greater than or equal to a target code length, and then a puncturing pattern (a puncturing location) is determined by the mother code length and the target code length. The puncturing pattern can be represented by using a binary sequence (00 . . . 011 . . . 1. It is determined that "0" represents a puncturing location, and "1" represents a non-puncturing location. A channel capacity corresponding to the puncturing location is set to 0 (or an error probability is set to 1 or a signal-to-noise ratio SNR is set to infinitesimal); a density evolution, Gaussian approximation, or linear fitting method is used to calculate reliability of polarized channels, and reliability is sorted; and an information bit location and a fixed bit (frozen bit) location are determined. The encoder deletes a coded bit at a puncturing location, to obtain a polar code.

According to the polar code shortening scheme described in this application, it is determined that a mother code length is 2 raised to the integer power and is greater than or equal to a target code length. A coded bit at a shortening location is related only to a fixed bit. The process includes: calculating reliability of polarized channels based on a mother code; and then determining a shortening location, placing a fixed bit on a corresponding polarized channel, determining an information bit location and a frozen bit (fixed bit) location from remaining polarized channels based on the reliability, and deleting a coded bit at a shortening location, to obtain a polar code, thereby implementing rate matching. According to the shortening-based encoding and rate matching scheme, reliability of a polarized channel does not need to be re-calculated based on a shortening location. Instead, a fixed bit is merely placed on a polarized channel corresponding to the shortening location. Therefore, polar code construction complexity is greatly reduced.

Figure 9:
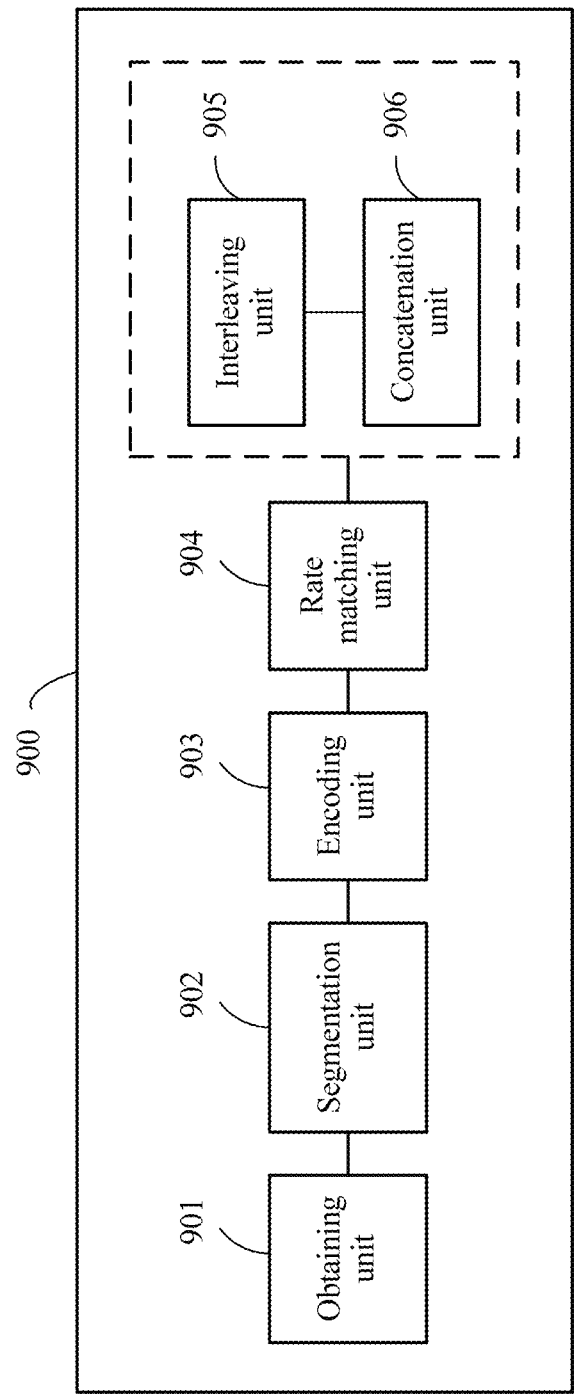
FIG. 9 is a block diagram of an encoding apparatus according to an embodiment of this application.

FIG. 9 is a schematic structural diagram of an encoding apparatus 900 according to this application. The encoding apparatus 900 includes an obtaining unit 901, a segmentation unit 902, and an encoding unit 903.

The obtaining unit 901 is configured to obtain a to-be-encoded information bit sequence.

The segmentation unit 902 is configured to divide the to-be-encoded information bit sequence into p segments if a coding parameter meets a preset segmentation condition, where p is an integer greater than 1. For the segmentation condition and a segmentation manner, refer to the content described in the encoding method in this application.

The encoding unit 903 is configured to separately perform polar encoding on the p segments to obtain p encoded bit sequences. The encoding apparatus may have p encoding units 903, configured to separately encode the p segments in parallel. As shown in FIG. 3 and FIG. 4, the encoding apparatus includes two polar encoding units. Alternatively, one encoding unit 903 may be configured to sequentially and separately encode the p segments.

Optionally, the encoding apparatus 900 further includes a rate matching unit 904, configured to separately rate-match p encoding results, to obtain p encoded bit sequences whose lengths are target code lengths of the segments. The encoding apparatus may have p rate matching units 904, configured to separately rate-match the p segments in parallel. As shown in FIG. 3 and FIG. 4, the encoding apparatus includes two rate matching units. Alternatively, one rate matching unit may be configured to sequentially and separately rate-match the p segments.

Optionally, the encoding apparatus 900 further includes an interleaving unit 905 and a concatenation unit 906. As shown in FIG. 3 and FIG. 4, interleaving and concatenation may be performed in different sequences. The interleaving unit 905 and the concatenation unit 906 may be differently configured depending on different sequences.

For example, in FIG. 3, interleaving is performed before concatenation. In this case, the interleaving unit 905 is configured to separately interleave the p rate matching output segments. The encoding apparatus 900 may include one interleaving unit 905, configured to sequentially and separately interleave the p segments; or may include p interleaving units 905, separately configured to interleave the p segments in parallel. The concatenation unit is configured to concatenate the p interleaved segments. A concatenation manner may be sequential concatenation or interlacing concatenation, and a specific concatenation method is the same as that described in the encoding method described above.

For example, in FIG. 4, concatenation is performed before interleaving. In this case, the concatenation unit 906 is configured to concatenate the p rate matching output segments. A concatenation manner may be sequential concatenation or interlacing concatenation, and a specific concatenation method is the same as that described in the encoding method described above. The interleaving unit 905 is configured to interleave a concatenated encoded sequence. In this case, only one interleaving unit 905 is required.

The segmentation unit 902 is not necessarily required. Alternatively, the encoding apparatus 900 may include: an obtaining unit 901, configured to obtain a to-be-encoded information bit sequence, where the to-be-encoded information bit sequence includes p segments, and a coding parameter for the polar encoding meets a preset segmentation condition; and an encoding unit 903, configured to separately perform polar encoding on the p segments to obtain p encoded bit sequences, where p is an integer greater than 1. A sequence and method of performing rate matching, interleaving, and concatenation on the p encoded bit sequences are the same as those described above.

Figure 10:
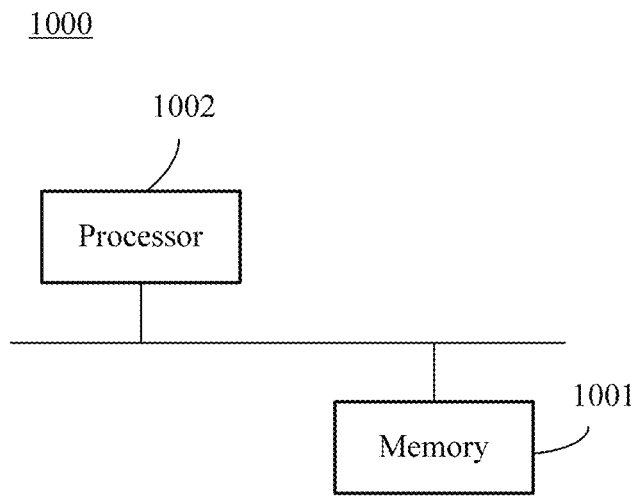
FIG. 10 is a simplified structural diagram of an encoding apparatus according to an embodiment of this application.

FIG. 10 is a schematic structural diagram of another encoding apparatus 1000 according to this application. The encoding apparatus 1000 includes a memory 1001 and a processor 1002. The memory 1001 is configured to store a program and the processor is configured to execute the program. When the program is executed, the processor obtains a to-be-encoded information bit sequence, divides the to-be-encoded information bit sequence into p segments if a coding parameter meets a preset segmentation condition, and separately perform polar encoding on the p segments to obtain p encoded bit sequences, where p is an integer greater than 1.

The segmentation action is optional. Therefore, the processor 1002 may be configured to: execute the program stored in the memory 1001; and when the program is executed, obtain a to-be-encoded information bit sequence, where the to-be-encoded information bit sequence includes p segments, and a coding parameter for the polar encoding meets a preset segmentation condition; and separately perform polar encoding on the p segments to obtain p encoded bit sequences, where p is an integer greater than 1.

Optionally, the processor 1002 is further configured to: separately rate-match the p encoded bit sequences, separately interleave the p rate matching output segments, and concatenate the p interleaved segments. Alternatively, the processor 1002 is further configured to: separately rate-match the p encoded bit sequences, concatenate the p rate matching output segments, and interleave a concatenated bit sequence.

The encoding apparatus in FIG. 10 may further include a transmitter (not shown in the figure), configured to send the encoded bit sequences obtained by the processor.

Figure 11:
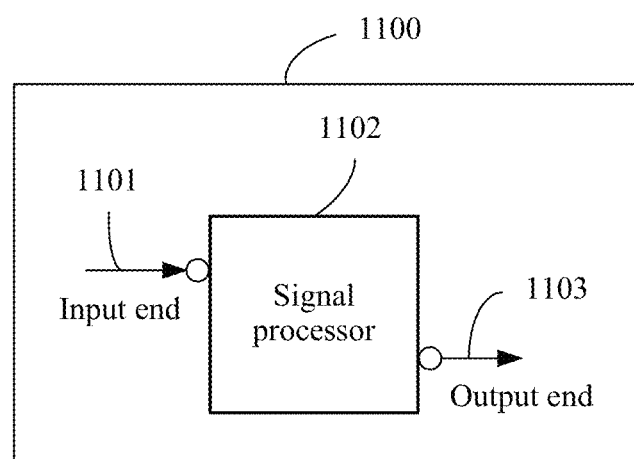
FIG. 11 is a simplified structural diagram of an encoding apparatus according to another embodiment of this application.

FIG. 11 is a schematic structural diagram of another encoding apparatus 1100 according to this application. The encoding apparatus 1100 includes at least one input end 1101, a signal processor 1102, and at least one output end 1103. The at least one input end 1101 is configured to receive a to-be-encoded information bit sequence. The signal processor 1102 is configured to obtain the to-be-encoded information bit sequence, divide the to-be-encoded information bit sequence into p segments if a coding parameter meets a preset segmentation condition, and separately perform polar encoding on the p segments to obtain p encoded bit sequences, where p is an integer greater than 1. The at least one output end 1103 is configured to output the p encoded bit sequences obtained by the signal processor.

The segmentation action is optional. Therefore, the signal processor 1002 may be configured to: obtain the to-be-encoded information bit sequence, where the to-be-encoded information bit sequence includes p segments, and a coding parameter for the polar encoding meets a preset segmentation condition; and separately perform polar encoding on the p segments to obtain p encoded bit sequences, where p is an integer greater than 1.

Optionally, the signal processor 1302 is further configured to: separately rate-match the p encoded bit sequences, separately interleave the p rate matching output segments, and concatenate the p interleaved segments. Alternatively, the signal processor 1302 is further configured to: separately rate-match the p encoded bit sequences, concatenate the p rate matching output segments, and interleave a concatenated bit sequence.

The encoding apparatus in FIG. 11 may further include a transmitter (not shown in the figure), configured to send the encoded bit sequence of a length M that is output by the at least one output end.

The encoding apparatuses in FIG. 9 to FIG. 11 in this application each may be any device having a wireless communication function, for example, an access point, a station, user equipment, or a base station. For a function executed by each component in the encoding apparatus and a specific execution method of the function, refer to related content in the encoding method embodiment. Details are not described herein again.

Figure 12:
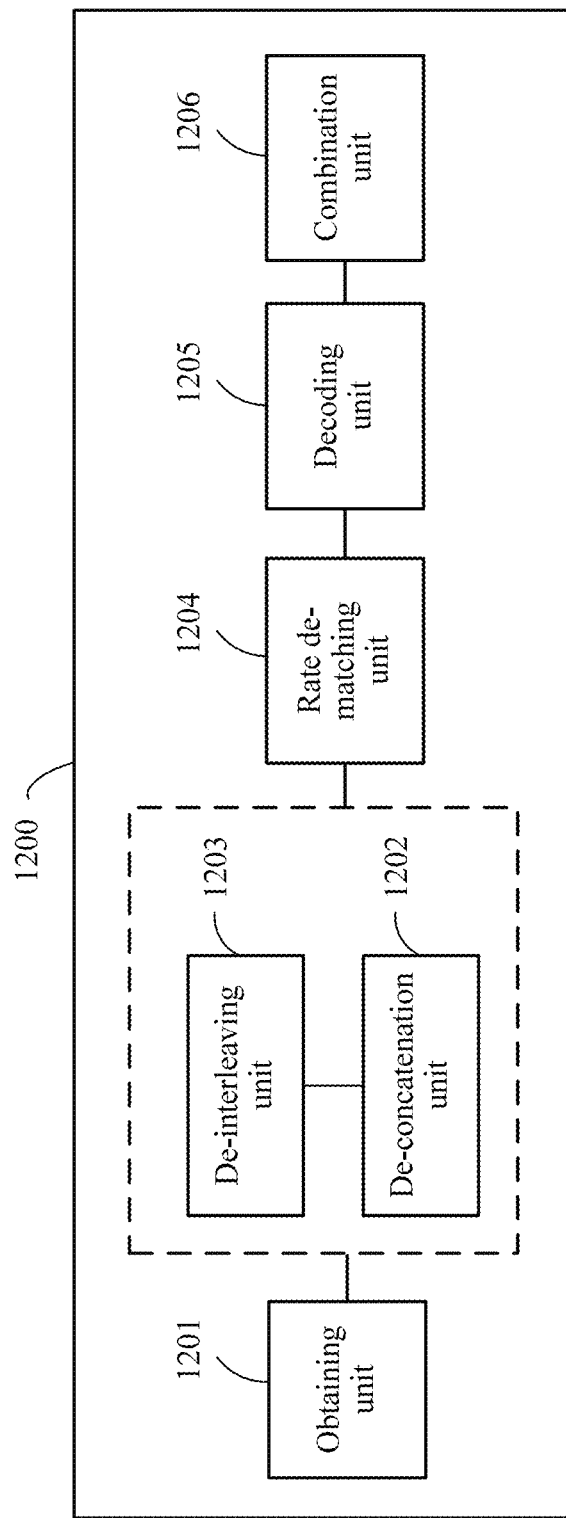
FIG. 12 is a block diagram of a decoding apparatus according to an embodiment of this application.

FIG. 12 is a block diagram of a decoding apparatus 1200 according to this application. The decoding apparatus 1200 includes an obtaining unit 1201, a de-concatenation unit 1202, a decoding unit 1205, and a combination unit 1206.

The obtaining unit 1201 is configured to obtain a log-likelihood ratio LLR sequence corresponding to to-be-decoded bits.

The de-concatenation unit is configured to de-concatenate the LLR sequence if a coding parameter meets a preset segmentation condition, to obtain LLR sequences of p segments, where p is an integer greater than 1.

The decoding unit 1205 is configured to separately perform SCL decoding on the LLR sequences of the p segments, to obtain decoding results of the p segments. The decoding apparatus 1200 may have p decoding units 1205, configured to separately perform SCL decoding on the LLR sequences of the p segments in parallel; or may have only one decoding unit 1205, configured to sequentially and separately perform SCL decoding on the LLR sequences of the p segments.

The combination unit 1206 is configured to: combine the decoding results, of the p segments, that are obtained by the decoding unit 1205, and output a decoded bit sequence.

Optionally, the decoding apparatus further includes a de-interleaving unit 1203 and a rate de-matching unit 1204. Corresponding to an encoder, de-interleaving and de-concatenation may be performed in different sequences. For example, in FIG. 6, an LLR sequence is de-concatenated and then de-interleaved. In this case, the de-interleaving unit 1203 is configured to separately de-interleave the de-concatenated LLR sequences of the p segments, and the rate de-matching unit 1204 is configured to separately rate de-match the p de-interleaved segments. The decoding apparatus 1200 may include one de-interleaving unit 1203, configured to sequentially and separately de-interleave the LLR sequences of the p segments; or may include p de-interleaving units, configured to separately de-interleave the LLR sequences of the p segments in parallel. The decoding apparatus 1200 may include one rate de-matching unit 1204, configured to sequentially and separately rate de-match the LLR sequences of the p segments; or may include p rate de-matching units, configured to separately rate de-match the LLR sequences of the p segments in parallel.

For example, in FIG. 7, an LLR sequence is de-interleaved and then de-concatenated. In this case, the de-interleaving unit 1203 is configured to de-interleave the obtained LLR sequence. In this case, only one de-interleaving unit 1203 is required. The de-concatenation unit is configured to de-concatenate the de-interleaved LLR sequence.

Figure 13:
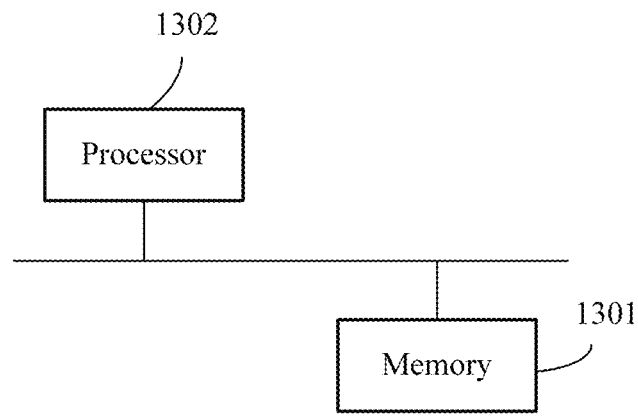
FIG. 13 is a simplified structural diagram of a decoding apparatus according to an embodiment of this application.

FIG. 13 is a schematic structural diagram of a decoding apparatus 1300 according to this application. The decoding apparatus 1300 includes a memory 1301 and a processor 1302. The memory 1301 is configured to store a program. The processor 1302 is configured to execute the program stored in the memory. When the program is executed, the processor obtains a log-likelihood ratio (LLR) sequence corresponding to to-be-decoded bits. The processor de-concatenates the LLR sequence if a coding parameter meets a preset segmentation condition, to obtain LLR sequences of p segments. The processor separately performs SCL decoding on the LLR sequences of the p segments, to obtain decoding results of the p segment. The processor combines the decoding results of the p segments, and outputs a decoded bit sequence, where p is an integer greater than 1.

Optionally, the processor 1302 is further configured to: de-interleave the de-concatenated LLR sequences of the p segments; rate de-match the p de-interleaved segments; separately perform SCL decoding on rate de-matched LLR sequences of the p segments, to obtain decoding results of the p segments; and combine the decoding results of the p segments, and output a decoded bit sequence, where p is an integer greater than 1. Alternatively, the processor 1302 is further configured to: de-interleave the obtained LLR sequence; de-concatenate the de-interleaved LLR sequence; rate de-match the p de-concatenated segments; separately perform SCL decoding on rate de-matched LLR sequences of the p segments, to obtain decoding results of the p segments; and combine the decoding results of the p segments, and output a decoded bit sequence, where p is an integer greater than 1.

Figure 14:
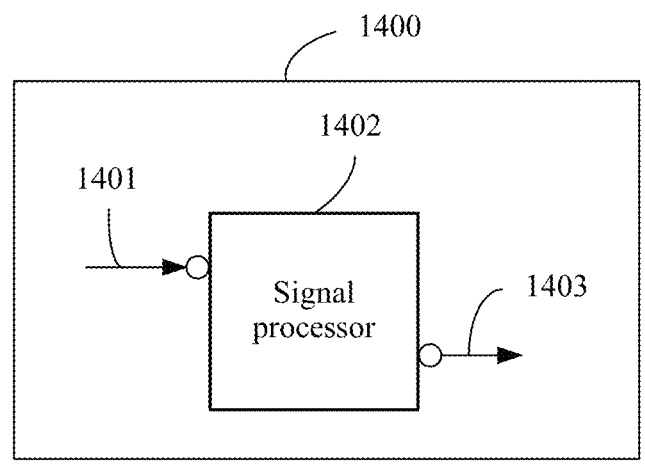
FIG. 14 is a simplified structural diagram of a decoding apparatus according to another embodiment of this application.

FIG. 14 is a schematic structural diagram of a decoding apparatus 1400 according to this application. The decoding apparatus 1400 includes at least one input end 1401, a signal processor 1402, and at least one output end 1403. The at least one input end 1401 is configured to receive log-likelihood ratios LLRs corresponding to to-be-decoded bits. The signal processor 1402 is configured to: obtain the log-likelihood ratio LLR sequence corresponding to the to-be-decoded bits; de-concatenate the LLR sequence if a coding parameter meets a preset segmentation condition, to obtain LLR sequences of p segments; separately perform SCL decoding on the LLR sequences of the p segments, to obtain decoding results of the p segments; and combine the decoding results of the p segments, and output a decoded bit sequence, where p is an integer greater than 1. The at least one output end 1403 is configured to output the decoded bit sequence obtained by the signal processor.

Optionally, the signal processor 1402 is configured to: de-interleave the de-concatenated LLR sequences of the p segments; rate de-match the p de-interleaved segments; and separately perform SCL decoding on rate de-matched LLR sequences of the p segments. Alternatively, the signal processor 1402 is configured to: if the coding parameter meets the preset segmentation condition, de-interleave the obtained LLR sequence before de-concatenation; de-concatenate the de-interleaved LLR sequence; rate de-match the p de-interleaved segments; and separately perform SCL decoding on rate de-matched LLR sequences of the p segments.

The decoding apparatuses in FIG. 12 to FIG. 14 in this application each may be any device having a wireless communication function, for example, an access point, a station, user equipment, a terminal device, or a base station. For a function executed by each component in the decoding apparatus and a specific execution method of the function, refer to related parts in FIG. 5 to FIG. 7 and the embodiments in FIG. 3 to FIG. 6 and FIG. 8 to FIG. 10. Details are not described herein again.

In many cases, a communication apparatus in a communication system has both a sending function and a receiving function, and can be used both as a transmitting end to send information to a receiving end and as a receiving end to receive information sent by a transmitting end. Therefore, the communication apparatus has both an encoding function and a decoding function. The communication apparatus may be configured as a general processing system, for example, is collectively referred to as a chip. The general processing system includes one or more microprocessors that provide processor functions, and an external memory that provides at least a part of a storage medium. All these components may be connected to other supporting circuits by using an external bus architecture.

The communication apparatus may include an application-specific integrated circuit (ASIC) having a processor, a bus interface, and a user interface; and at least a part of a storage medium integrated into a single chip. Alternatively, the communication apparatus is implemented by using one or more field programmable gate array (FPGA), a programmable logic device (PLD), a controller, a state machine, gate logic, a discrete hardware component, any other proper circuit, a circuit capable of executing functions described throughout this application, or any combination thereof.

Figure 15:
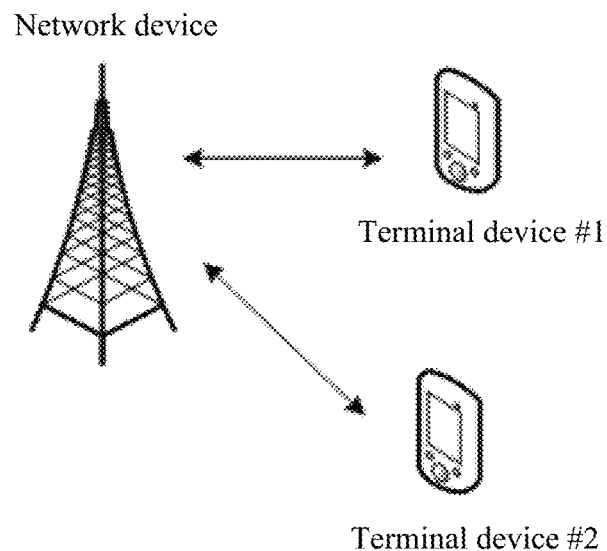
FIG. 15 is a diagram of a wireless communication system to which embodiments of this application may be applied.

FIG. 15 shows a wireless communication system to which embodiments of this application can be applied. The wireless communication system may include at least one network device, and the network device communicates with one or more terminal devices. The network device may be a base station, may be a device obtained after a base station and a base station controller are integrated, or may be another device having similar communication functions.

The wireless communication systems described in embodiments of this application includes but is not limited to: Narrowband Internet of Things (NB-IoT) systems; Long Term Evolution (LTE) systems; three main application scenarios of fifth-generation (5G) mobile communication systems: Enhanced Mobile Broadband (eMBB), ultra-reliable and low latency communications (URLLC), enhanced Machine Type Communication (eMTC) and massive type communications (mMTC); or any future new communication systems.

In FIG. 15, the network device communicates with the terminal device by using a wireless technology. When sending a signal, the network device is a transmit device, and when receiving a signal, the network device is a receiving device. The same is true for the terminal device. When sending a signal, the terminal device is a transmit device, and when receiving a signal, the terminal device is a receiving device. Both the network device and the terminal device in FIG. 15 are communication apparatuses described in embodiments of this application. As a transmit device, the communication apparatus has an encoding function and can perform the encoding method in this application. As a receiving device, the communication apparatus has a decoding function and can perform the decoding method in this application.

Figure 16:
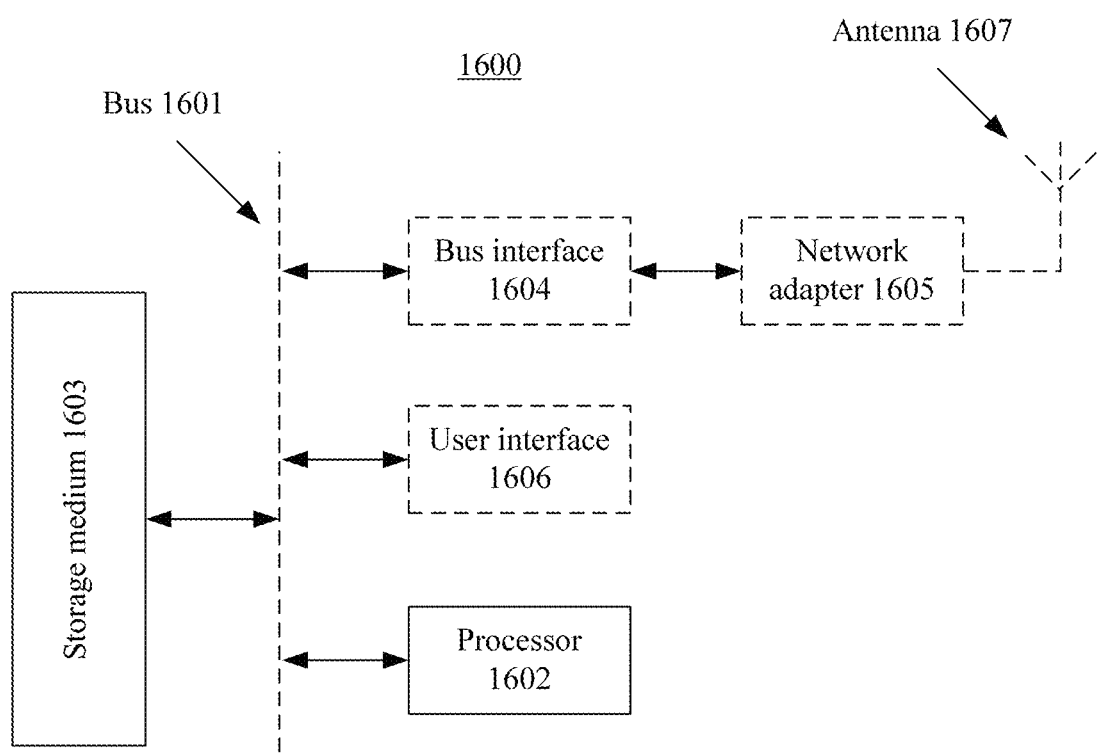
FIG. 16 is a simplified structural diagram of a communication apparatus according to an embodiment of this application.

FIG. 16 is a schematic structural diagram of a communication apparatus 1600 (for example, a communication apparatus such as an access point, a base station, a station, or a terminal device) according to an embodiment of this application. As shown in FIG. 16, the communication apparatus 1600 may be implemented by using a bus 1601 as a general bus architecture. The bus 1601 may include any quantity of interconnected buses and bridges based on specific application and an overall design constraint condition of the communication apparatus 1600. The bus 1601 connects various circuits, and these circuits include a processor 1602, a storage medium 1603, and a bus interface 1604. The storage medium is configured to store an operating system and to-be-sent or to-be-received data. Optionally, the communication apparatus 1600 uses the bus interface 1604 to connect a network adapter 1605 and the like by using the bus 1601. The network adapter 1605 may be configured to: implement a signal processing function of a physical layer in a wireless communication network, and send and receive a radio frequency signal by using an antenna 1607. A user interface 1606 may be connected to various user input devices, such as a keyboard, a display, a mouse, and a joystick. The bus 1601 may be further connected to various other circuits, such as a timing source, a peripheral device, a voltage regulator, and a power management circuit. These circuits are well-known in the art, and therefore are not described in detail.

The processor 1602 is responsible for managing the bus and general processing (including executing software stored in the storage medium 1603). The processor 1602 may be implemented by using one or more general-purpose processors and/or dedicated processors. Examples of the processor include a microprocessor, a microcontroller, a DSP processor, and other circuits capable of executing software. The software should be broadly construed as representation of instructions, data, or any combination thereof regardless of whether the software is referred to as software, firmware, middleware, microcode, hardware description language, or else.

It is shown in FIG. 16 that the storage medium 1603 is separated from the processor 1602. However, persons skilled in the art easily understand that the storage medium 1603 or any part of the storage medium 1603 may be located outside the communication apparatus 1600. For example, the storage medium 1603 may include a transmission wire, a carrier waveform modulated by using data, and/or a computer product separated from a wireless node. All these media are accessible to the processor 1602 by using the bus interface 1604. Alternatively, the storage medium 1603 or any part of the storage medium 1603 may be integrated into the processor 1602, for example, may be a cache and/or a general-purpose register.

The processor 1602 may be configured to execute functions of the processor 1002 in FIG. 10 and the processor 1302 in FIG. 13. The processor 1602 may perform the encoding method and the decoding method described in this application. An execution process of the processor 1602 is not described herein.

Figure 17:
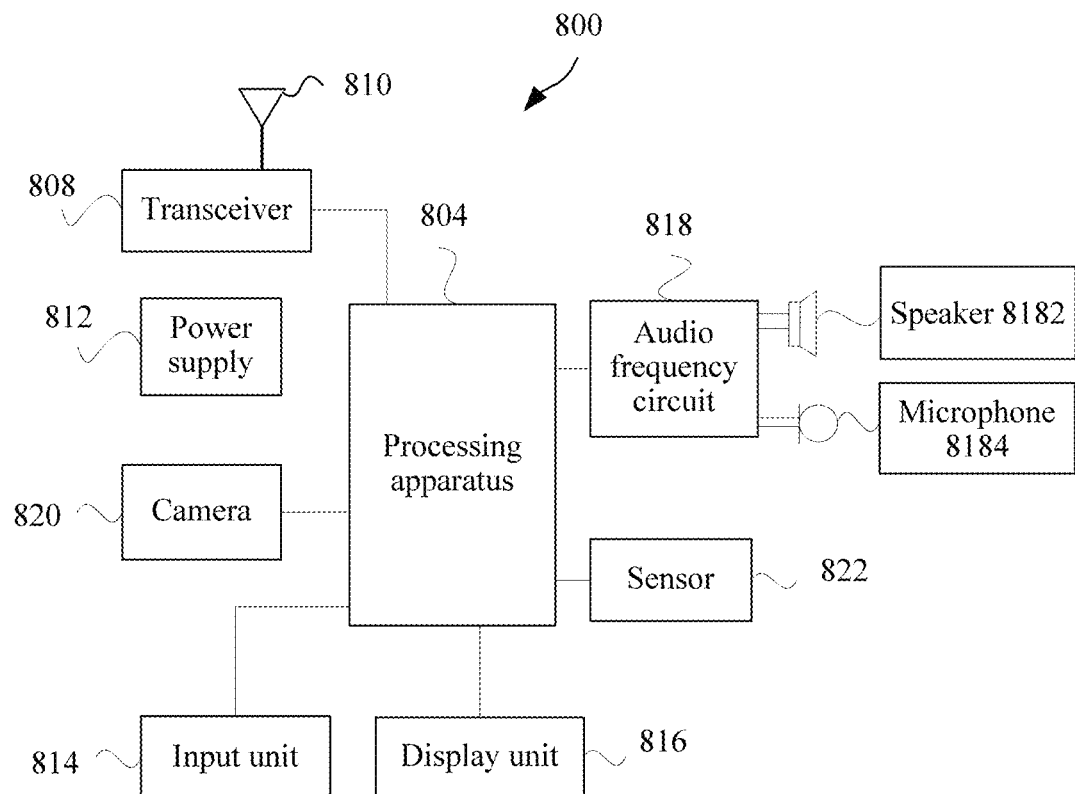
FIG. 17 is a simplified structural diagram of a terminal device according to an embodiment of this application.

When the communication apparatus is a terminal device, referring to FIG. 17, FIG. 17 is a schematic structural diagram of a terminal device 800. The terminal device 800 includes a processing apparatus 804 that may be configured to perform the encoding method and/or the decoding method described in the embodiments of this application. The terminal device 800 may further include a power supply 812, configured to supply power to various components or circuits in the terminal device. The terminal device may further include an antenna 810, configured to: send, by using a wireless signal, uplink data output by a transceiver, or output a received wireless signal to a transceiver.

In addition, the terminal device may include one or more of an input unit 814, a display unit 816, an audio frequency circuit 818, a camera 820, and a sensor 822, to further improve a function of the terminal device. The audio frequency circuit may include a speaker 8182, a microphone 8184, and the like.

The successive cancellation list SCL decoding algorithm described in the embodiments of this application includes another decoding algorithm, similar to the SCL, in which decoding is performed sequentially, and that provides a plurality of candidate paths; or an improved algorithm for the SCL decoding algorithm.

In actual use, the encoding apparatus or the decoding apparatus described in the embodiments of this application may be an independent device or may be an integrated device; and is configured to: encode to-be-sent information and then send encoded information, or decode received information.

In the examples described in the embodiments of this application, units and method processes can be implemented by electronic hardware or a combination of computer software and electronic hardware. Whether the functions are executed by hardware or software depends on particular applications and design constraint conditions of the technical solutions. Persons skilled in the art can implement the described functions by using different methods with regard to each specific application.

In the several embodiments provided in this application, it should be understood that the disclosed apparatus and method may be implemented in other manners. The described apparatus embodiments are merely examples. For example, the unit division is merely logical function division and may be other division during actual implementation. For example, a plurality of units or components may be combined or integrated into another system. Some steps in the method may be ignored or not performed. In addition, couplings or direct couplings or communication connections between the units may be implemented by using some interfaces, and these interfaces may be implemented in electronic, mechanical, or other forms. The units described as separate parts may or may not be physically separate, and may be located in one location or may be distributed on a plurality of network units. In addition, the functional units in the embodiments of this application may be integrated into one processing unit, or each of the units may exist alone physically, or two or more units are integrated into one unit.

All or some of the foregoing embodiments may be implemented by software, hardware, firmware, or any combination thereof. When being implemented by software, all or some of the embodiments may be implemented in a form of a computer program product. The computer program product includes one or more computer instructions. When the computer program instructions are loaded and executed on a computer, all or some of the procedures or functions according to the embodiments of the present invention are generated. The computer may be a general-purpose computer, a dedicated computer, a computer network, or other programmable apparatuses. The computer instructions may be stored in a computer-readable storage medium, or may be transmitted by using the computer-readable storage medium. The computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible to a computer, or a data storage device, such as a server or a data center, integrating one or more usable media. The usable medium may be a magnetic medium (for example, a floppy disk, a hard disk, a magnetic tape, a USB flash drive, a ROM, or a RAM), an optical medium (for example, a CD or a DVD), a semiconductor medium (for example, a solid state disk (SSD)), or the like.

The foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of the present invention.

What is claimed is:

1. A method for processing information bit sequences, performed by a device in a wireless communication network, comprising:
    obtaining an information bit sequence of a bit length K, and obtaining a code length M, wherein the code length M is a length of an output sequence resulting from the information bit sequence, wherein K and M are positive integers;
    when M is greater than or equal to a first threshold and K is greater than or equal to a second threshold, dividing the information bit sequence into p subsequences that are of an equal length $K_1$, wherein p is an integer greater than 1, and wherein the second threshold is a value in a range of [300, 360];
    polar encoding each of the p subsequences to obtain p encoded subsequences;
    rate matching each of the p encoded subsequences to obtain p rate matched subsequences;
    concatenating the p rate matched subsequences, to obtain the output sequence, wherein the output sequence has a length of M; and
    transmitting the output sequence;
    wherein polar encoding each of the p subsequences to obtain p encoded subsequences comprises:
    for each subsequence, generating a binary row vector $u_1^N$, wherein $N \geq K_1$, $u_1^N = (u_1, u_2, \ldots, u_N)$, and $K_1$ bit-positions of the binary row vector $u_1^N$ are occupied by $K_1$ bits of the subsequence; and
    encoding the binary row vector $u_1^N$ according to an encoding formula, to obtain the encoded subsequence;
    wherein the encoding formula is:

$$x_1^N = u_1^N G_N,$$

where $x_1^N = (x_1, x_2, \ldots, x_N)$ is the encoded subsequence, and $G_N$ is a polar code generating matrix of N rows and N columns.

2. The method according to claim 1, wherein p=2.

3. The method according to claim 1, wherein the second threshold is 360.

4. The method according to claim 1, wherein
    the first threshold is a constant; or
    the first threshold is determined based on at least one of:
    a code rate R or the bit length of the information bit sequence K.

5. The method according to claim 1, wherein rate matching each of the p encoded subsequences to obtain p rate matched subsequences comprises:
    if a total length of the encoded subsequences is greater than M, puncturing or shortening at least one of the encoded subsequences, to obtain p rate matched subsequences whose total length is M.

6. A device in a wireless communication network, comprising:
    a processor and a memory storing program instructions for execution by the processor; wherein when executed by the processor, the program instructions cause the device to:
    obtain an information bit sequence of a bit length K, and obtain a code length M, wherein the code length M is a length of an output sequence resulting from the information bit sequence, wherein K and M are positive integers;
    when M is greater than or equal to a first threshold and K is greater than or equal to a second threshold, divide the information bit sequence into p subsequences that are of an equal length $K_1$, wherein p is an integer greater than 1, and wherein the second threshold is a value in a range of [300, 360];
    polar encode each of the p subsequences to obtain p encoded subsequences;
    rate match each of the p encoded subsequences to obtain p rate matched subsequences;
    concatenate the p rate matched subsequences, to obtain the output sequence, wherein the output sequence has a length of M; and
    transmit the output sequence;
    wherein in polar encoding each of the p subsequences, by executing the program instructions, the processor is configured to:
    for each subsequence, generate a binary row vector $u_1^N$, wherein $N \geq K_1$, $u_1^N = (u_1, u_2, \ldots, u_N)$, and $K_1$ bit-positions of the binary row vector $u_1^N$ are occupied by $K_1$ bits of the subsequence; and
    encode the binary row vector $u_1^N$ according to an encoding formula, to obtain the encoded subsequence;
    wherein the encoding formula is:

$$x_1^N = u_1^N G_N,$$

where $x_1^N = (x_1, x_2, \ldots, x_N)$ is the encoded subsequence, and $G_N$ is a polar code generating matrix of N rows and N columns.

7. The device according to claim 6, wherein p=2.

8. The device according to claim 6, wherein the second threshold is 360.

9. The device according to claim 6, wherein
    the first threshold is a constant, or
    the first threshold is determined based on at least one of a code rate R or the bit length of the information bit sequence K.

10. The device according to claim 6, wherein the device is a base station or a user terminal.

11. A non-transitory computer readable medium storing program codes thereon for execution by a processor in a communication device, wherein the program codes comprise instructions for:
    obtaining an information bit sequence of a bit length K, and obtaining a code length M, wherein the code length M is a length of an output sequence resulting from the information bit sequence, wherein K and M are positive integers;
    when M is greater than or equal to a first threshold and K is greater than or equal to a second threshold, dividing the information bit sequence into p subsequences that are of an equal length $K_1$, wherein p is an integer greater than 1, wherein the second threshold is a value in a range of [300, 360];
    polar encoding each of the p subsequences to obtain p encoded subsequences;

rate matching each of the p encoded subsequences to obtain p rate matched subsequences;
concatenating the p rate matched subsequences, to obtain the output sequence; and
transmitting the output sequence, wherein the output sequence has a length of M;
wherein the instructions for polar encoding each of the p subsequences to obtain p encoded subsequences comprise:
for each subsequence, generating a binary row vector $u_1^N$, wherein $N \geq K_1$, $u_1^N = (u_1, u_2, \ldots, u_N)$, and $K_1$ bit-positions of the binary row vector $u_1^N$ are occupied by $K_1$ bits of the subsequence; and
encoding the binary row vector $u_1^N$ according to an encoding formula, to obtain the encoded subsequence;
wherein the encoding formula is:

$$x_1^N = u_1^N G_N,$$

where $x_1^N = (x_1, x_2, \ldots, x_N)$ is the encoded subsequence, and $G_N$ is a polar code generating matrix of N rows and N columns.

12. The non-transitory computer readable medium according to claim 11, wherein p=2.

13. The non-transitory computer readable medium according to claim 11, wherein the second threshold is 360.

14. The non-transitory computer readable medium according to claim 11, wherein
the first threshold is a constant; or
the first threshold is determined based on at least one of: a code rate R or the bit length of the information bit sequence K.

* * * * *